(12) United States Patent
Wolcott et al.

(10) Patent No.: US 9,065,554 B2
(45) Date of Patent: Jun. 23, 2015

(54) SYSTEM AND METHOD FOR ANALYZING A NETWORK

(75) Inventors: Lawrence D. Wolcott, Denver, CO (US); Jonathan A. Leech, Denver, CO (US); Nicholas A. Pinckernell, Littleton, CO (US)

(73) Assignee: Comcast Cable Communications, LLC, Philadelphia, PA (US)

( * ) Notice: Subject to any disclaimer, the term of this patent is extended or adjusted under 35 U.S.C. 154(b) by 62 days.

(21) Appl. No.: 13/564,345

(22) Filed: Aug. 1, 2012

(65) Prior Publication Data

US 2014/0036975 A1 Feb. 6, 2014

(51) Int. Cl.
*H04B 17/00* (2006.01)
*H04B 3/46* (2006.01)
*H04L 12/26* (2006.01)
*H04L 12/24* (2006.01)
*H04B 17/364* (2015.01)
*H04L 12/28* (2006.01)
*G01R 19/25* (2006.01)

(52) U.S. Cl.
CPC ............ *H04B 17/00* (2013.01); *H04L 41/0609* (2013.01); *H04L 41/0677* (2013.01); *H04L 43/0823* (2013.01); *H04B 17/364* (2015.01); *G01R 19/2506* (2013.01); *H04B 3/468* (2013.01); *H04L 12/2801* (2013.01)

(58) Field of Classification Search
CPC ........ H04B 3/46; H04B 17/00; H04B 17/364; H04B 3/468; H04N 21/615; H04N 21/44209; H04N 21/6118; H04N 17/00; H04L 12/2838; H04L 41/0677; H04L 41/0609; H04L 43/0823; G01R 31/00; G01R 19/2506

USPC ......... 375/224, 232, 229; 370/241, 242, 245; 379/29.01, 27.01, 1.01; 725/107, 105
See application file for complete search history.

(56) References Cited

U.S. PATENT DOCUMENTS

| | | | |
|---|---|---|---|
| 8,452,359 B2* | 5/2013 | Rebec et al. | 600/316 |
| 2011/0197071 A1* | 8/2011 | Wolcott et al. | 713/176 |
| 2011/0243214 A1* | 10/2011 | Wolcott et al. | 375/232 |
| 2014/0003478 A1* | 1/2014 | Liu et al. | 375/224 |
| 2014/0221813 A1* | 8/2014 | Bryant-Greenwood et al. | 600/407 |

OTHER PUBLICATIONS

"The Laws of Logarithms," mathcentre, 2009, accessed from http://www.mathcentre.ac.uk/resources/uploaded/mc-bus-loglaws-2009-1.pdf.*
DOCSIS® Best Practices and Guidelines Proactive Network Maintenance Using Pre-equalization CM-GL-PNMP-V02-110623, Cable Television Laboratories, Inc., Jun. 23, 2011.*
"The Laws of Logarithms," mathcentre, 2009, accessed from http://www.mathcentre.ac.uk/resources/uploaded/mc-bus-loglaws-2009-1.pdf.*
"device." Merriam-Webster.com. 2014. accessed from http://www.merriam-webster.com (Aug. 14, 2014).*

* cited by examiner

*Primary Examiner* — Chieh M Fan
*Assistant Examiner* — Michelle M Koeth
(74) *Attorney, Agent, or Firm* — Ballard Spahr, LLP

(57) ABSTRACT

System and methods for analyzing a network are disclosed. One method can comprise determining a parameter for each of a plurality of devices, generating a signature for each of the plurality of devices based upon the determined parameters, comparing the signatures of two or more of the plurality of devices, and grouping the plurality of devices based upon the comparison of the signatures of the two or more of the plurality of devices.

18 Claims, 21 Drawing Sheets

CM1 - 0d 01 10 18 00 04 00 10 ff f8 ff f1 00 0c 00 14 ff f3 ff e8 00 13 00 1
CM2 - 0d 01 10 18 00 04 00 0f ff ff ff f0 00 0c 00 16 ff f4 ff e7 00 12 00 1
CM3 - 0d 01 10 18 00 03 00 0e ff ff ff ef 00 0c 00 16 ff f3 ff e9 00 13 00 2
CM4 - 0d 01 10 18 00 04 00 0f ff ff ff f0 00 0c 00 15 ff f3 ff e8 00 12 00 2
CM5 - 0d 01 10 18 00 04 00 0f ff f8 ff f0 00 0c 00 15 ff f3 ff e8 00 13 00 2
CM6 - 0d 01 10 18 00 04 00 0f ff f7 ff ef 00 0c 00 14 ff f3 ff e9 00 13 00 2

FIG. 5B 0d 01 ⑩ ⑱ hffe ⎡ 00 04 00 0f ff f8 ff ............. 00 20 00 33 ff db ff bb
      ⎣ 00 38 00 6c ff 9b ff ............. ff ff ff ff ff ff 00 00 hdfe ⎡ ff 74 00 22 00 66 ff ............. 00 02 00 10 ff fe ff f1
      ⎢ 00 03 00 0a ff fd ff ............. 00 00 00 01 00 00 ff fa
      ⎣ ff 00 00 00 01 ff ............. ff fe 00 00 00 04 00 00

FIG. 5C

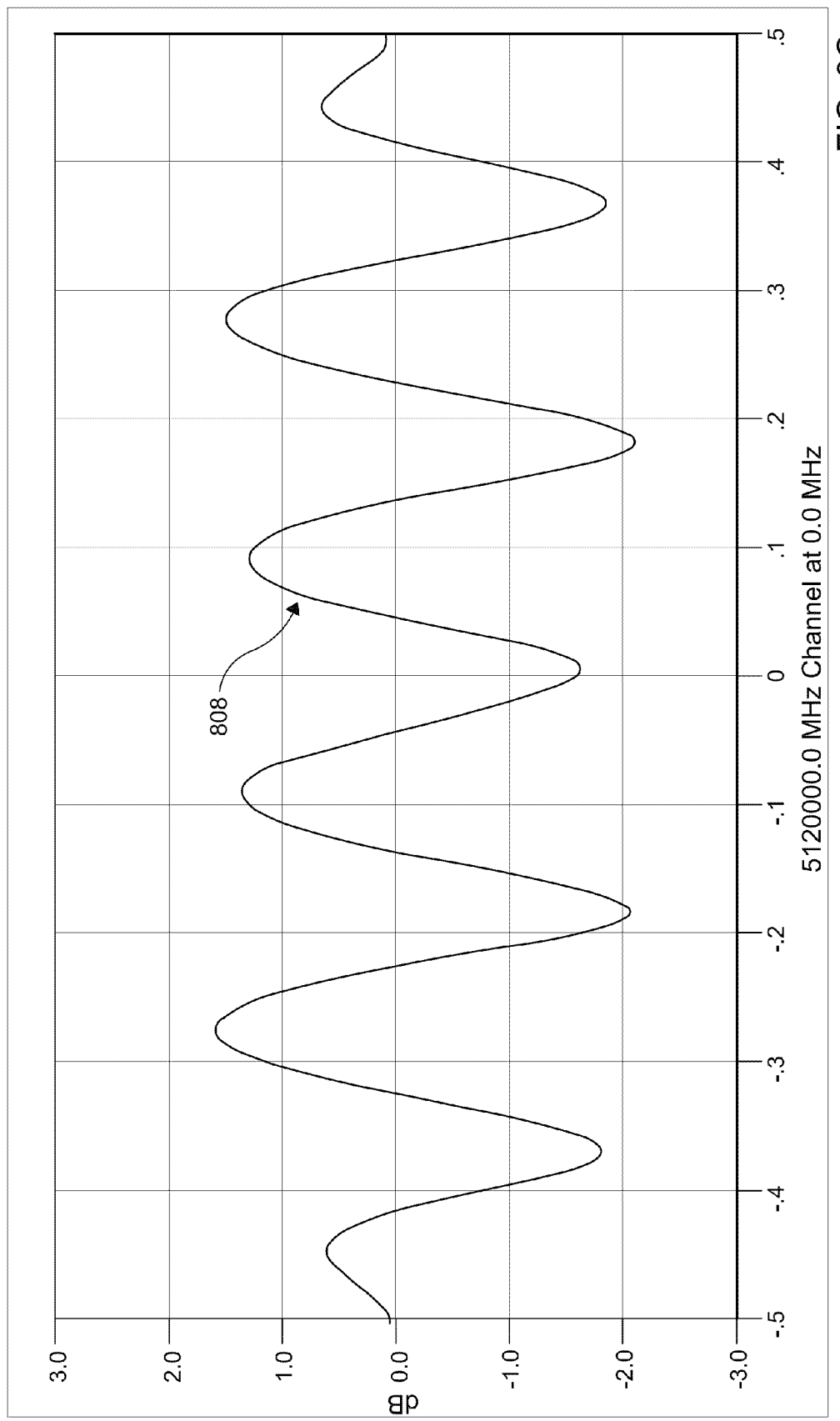

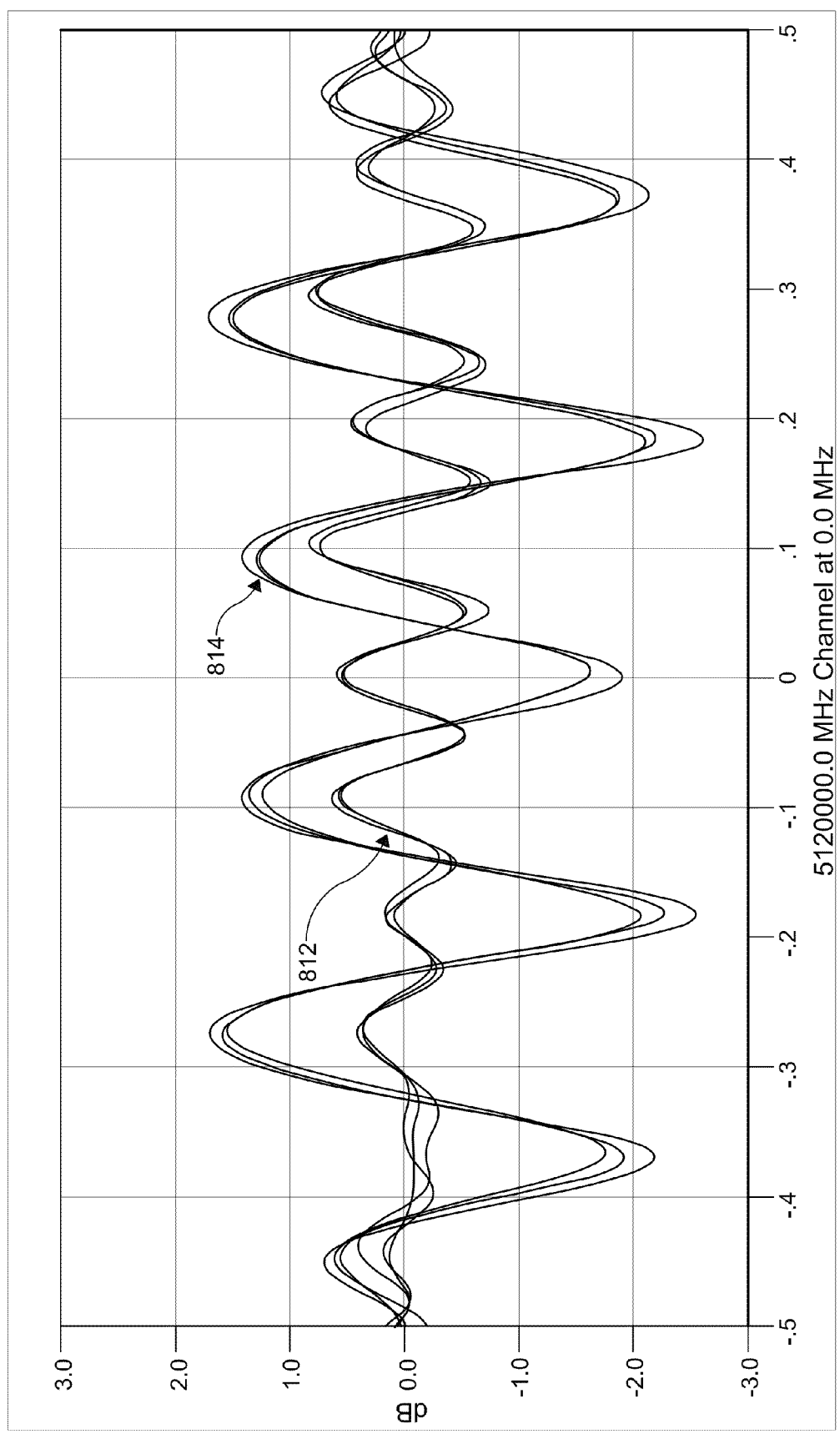

SYSTEM AND METHOD FOR ANALYZING A NETWORK

BACKGROUND

Assessing service quality for networks and network equipment can be tedious and time consuming. Installers, technicians, and care agents are often subject to guessing and frustrating trial-error evaluation of network impairments. This sometimes results in unusually high installation, troubleshooting, and resolution times due to unanticipated challenges in diagnosing network issues.

Current network service quality assessment relies on visual inspection of network signals (e.g., radio frequency waveforms, ripple count groupings, etc.). However, existing methods are not sufficient for analysis of data containing multiple distinct impairments due to the superimposition of impairments. Furthermore, frequency dependent waveform signatures generated from signal level or energy level measurement can be masked by echoes on the network. Visual inspection is often labor intensive due to the size and complexity of the problem, as is manually troubleshooting the network using conventional methods. In some instances, the overall service quality of a larger area can mask problems affecting smaller areas, making problem detection in smaller areas especially difficult. Accordingly, current methods do not provide a sufficient means for assessing service quality of a network.

SUMMARY

It is to be understood that both the following general description and the following detailed description are exemplary and explanatory only and are not restrictive. Provided are methods and systems for analyzing a network and associated devices.

In an aspect, coefficients such as Data Over Cable Service Interface Specification (DOCSIS) equalization coefficients for multiple devices can be gathered, analyzed, and converted to energy level waveforms or signatures. As an example, a plurality of energy levels (e.g., equalization taps, tap magnitudes) can be determined and grouped. One or more of the energy levels can be selectively removed from a group to perform tap defeat and echo cancellation on the remaining energy levels in the group. In an aspect, a Fourier transform can be applied to one or more energy levels (e.g., tap magnitudes, equalization tap, signal levels) to construct a waveform (e.g., radio frequency (RF)) signature in the frequency domain. As an example, signatures can be recursively grouped based on best fit of the results of complex division against each other. Accordingly, the resulting groups can comprise members sharing a common set of impairments, which are located nearby and/or upstream of the members of the group. As a further example, service quality scores or service scores can be computed for one or more groups.

In an aspect, a method for analyzing a network can comprise determining a parameter for each of a plurality of devices. A signature can be generated for each of the plurality of devices based upon the determined parameters. The signatures of two or more of the plurality of devices can be compared and the plurality of devices can be grouped based upon the comparison of the signatures of the two or more of the plurality of devices.

In an aspect, a method for analyzing a network can comprise determining a parameter for each of a plurality of devices and identifying each of the plurality of devices belonging to a first group, wherein a ratio value of the parameter of each of the plurality of devices in the first group is within a first pre-defined threshold. Each of the plurality of devices belonging to a second group can also be identified, a ratio value of the parameter of each of the plurality of devices in the second group can be within a second pre-defined threshold. The members of the first group and/or second group can be verified by comparing a ratio value of the parameter of one or more devices in the first group and one or more devices in the second group. As an example, the if the ratio value of the parameter of one or more devices in the first group and one or more devices in the second group exceeds one or more of the first threshold and the second threshold, then the grouping of devices can be verified.

In an aspect, a system can comprise a measurement device in signal communication with a network device, the measurement device configured to measure a characteristic comprising an equalization coefficient of the network device and a processor in communication with the measurement device. The processor can be configured to generate a network device parameter based upon the equalization coefficient, generate a network device signature based upon the parameter, and classify the network device based upon a comparison of the network device signature to a comparator element.

Although analysis of a DOCSIS compatible network is discussed to present aspects of the disclosure, techniques can be applied to any network of devices operating according to any standard or specification.

Additional advantages will be set forth in part in the description which follows or may be learned by practice. The advantages will be realized and attained by means of the elements and combinations particularly pointed out in the appended claims. It is to be understood that both the foregoing general description and the following detailed description are exemplary and explanatory only and are not restrictive, as claimed.

BRIEF DESCRIPTION OF THE DRAWINGS

The accompanying drawings, which are incorporated in and constitute a part of this specification, illustrate embodiments and together with the description, serve to explain the principles of the methods and systems:

FIG. 5B is exemplary equalization coefficient data;
FIG. 5C is a representation of data extraction from equalization coefficient data;
FIG. 8C is a graph of an exemplary signature waveform.

FIG. 8G is a graph of a plurality of exemplary signature waveforms;

DETAILED DESCRIPTION

Figure 1:
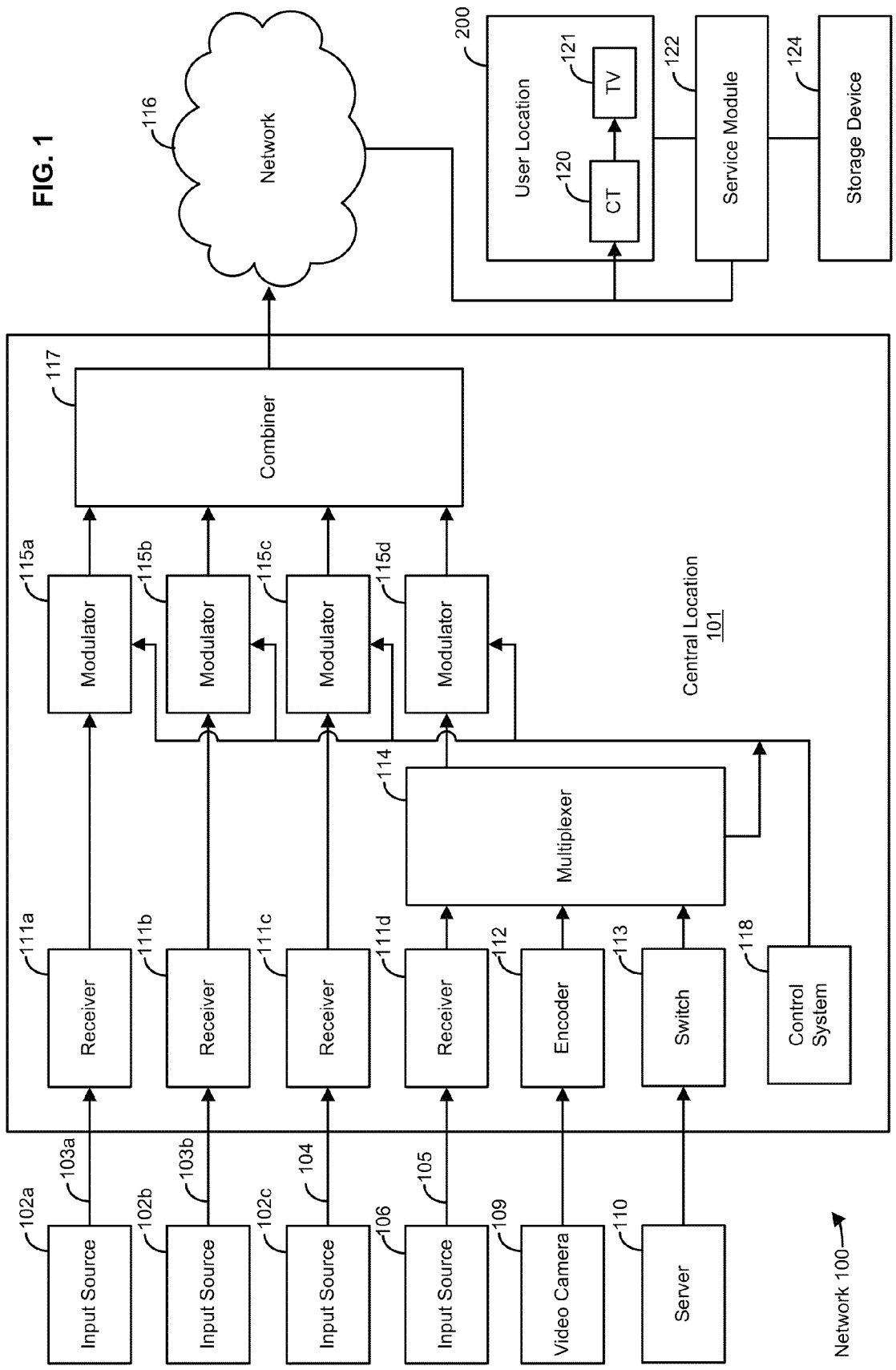
FIG. 1 is a block diagram of an exemplary network.

Before the present methods and systems are disclosed and described, it is to be understood that the methods and systems are not limited to specific methods, specific components, or to particular implementations. It is also to be understood that the terminology used herein is for the purpose of describing particular embodiments only and is not intended to be limiting.

As used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the examples included therein and to the Figures and their previous and following description.

As will be appreciated by one skilled in the art, the methods and systems may take the form of an entirely hardware embodiment, an entirely software embodiment, or an embodiment combining software and hardware aspects. Furthermore, the methods and systems may take the form of a computer program product on a computer-readable storage medium having computer-readable program instructions (e.g., computer software) embodied in the storage medium. More particularly, the present methods and systems may take the form of web-implemented computer software. Any suitable computer-readable storage medium may be utilized including hard disks, CD-ROMs, optical storage devices, or magnetic storage devices.

Embodiments of the methods and systems are described below with reference to block diagrams and flowchart illustrations of methods, systems, apparatuses and computer program products. It will be understood that each block of the block diagrams and flowchart illustrations, and combinations of blocks in the block diagrams and flowchart illustrations, respectively, can be implemented by computer program instructions. These computer program instructions may be loaded onto a general purpose computer, special purpose computer, or other programmable data processing apparatus to produce a machine, such that the instructions which execute on the computer or other programmable data processing apparatus create a means for implementing the functions specified in the flowchart block or blocks.

These computer program instructions may also be stored in a computer-readable memory that can direct a computer or other programmable data processing apparatus to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

Accordingly, blocks of the block diagrams and flowchart illustrations support combinations of means for performing the specified functions, combinations of steps for performing the specified functions and program instruction means for performing the specified functions. It will also be understood that each block of the block diagrams and flowchart illustrations, and combinations of blocks in the block diagrams and flowchart illustrations, can be implemented by special purpose hardware-based computer systems that perform the specified functions or steps, or combinations of special purpose hardware and computer instructions.

As described in greater detail below, in an aspect, a system can be configured to analyze a network (e.g., servicing one or more user locations). In an aspect, a network (e.g., distribution system) can distribute signals from a central location to the user location. Understanding service quality and service impairments for the network can enable deterministic trouble isolation and remote assessment of service quality.

FIG. 1 illustrates various aspects of an exemplary system and network in which the present methods and systems can operate. The present disclosure relates to systems and methods for inferring or determining a network topology. Those skilled in the art will appreciate that present methods may be used in systems that employ both digital and analog equipment. One skilled in the art will appreciate that provided herein is a functional description and that the respective functions can be performed by software, hardware, or a combination of software and hardware.

The system 100 can comprise a central location 101 (e.g., a processing facility, a central office, processing facility, or a headend), which can receive content (e.g., data, programming, and the like) from multiple sources. The central location 101 can combine the content from the various sources and can distribute the content to user (e.g., subscriber) locations (e.g., location 200) via network 116 (e.g., distribution system).

In an aspect, the central location 101 can receive content from a variety of sources 102a, 102b, 102c. The content can be transmitted from the source to the central location 101 via a variety of transmission paths, including wireless (e.g., satellite paths 103a, 103b) and terrestrial path 104. The central location 101 can also receive content from a direct feed source 106 via a direct line 105. Other input sources can comprise capture devices such as a video camera 109 or a server 110. The signals provided by the content sources can include a single content item or a multiplex that includes several content items.

The central location 101 can comprise one or a plurality of receivers 111a, 111b, 111c, 111d that are each associated with an input source. For example, MPEG encoders such as encoder 112, are included for encoding local content or a video camera 109 feed. A switch 113 can provide access to server 110, which can be a Pay-Per-View server, a data server, a network (e.g., internal router, a network system, a phone system, and the like. Some signals may require additional processing, such as signal multiplexing, prior to being modulated. Such multiplexing can be performed by multiplexer (mux) 114.

The central location 101, in one embodiment, can comprise one or a plurality of modulators, 115a, 115b, 115c, and 115d, for interfacing to the network 116. The modulators can convert the received content into a modulated output signal suitable for transmission over the network 116. The output signals from the modulators can be combined, using equipment such as a combiner 117, for input into the network 116.

A control system 118 can permit a system operator to control and monitor the functions and performance of system 100. The control system 118 can interface, monitor, and/or control a variety of functions, including, but not limited to, the channel lineup for the television system, billing for each user, conditional access for content distributed to users, and the like. Control system 118 can provide input to the modulators for setting operating parameters, such as system specific MPEG table packet organization or conditional access information. The control system 118 can be located at central location 101 or at a remote location.

The network 116 can distribute signals from the central location 101 to user locations, such as user location 200. The network 116 can be an optical fiber network, a coaxial cable network, a hybrid fiber-coaxial network, a wireless network, a satellite system, a direct broadcast system, or any combination thereof. There can be a multitude of user locations connected to network 116. At user location 200 a decoder 120, such as a gateway or communications terminal (CT) can decode, if needed, the signals for presentation to a display device, such as on a handheld device or television set (TV) 121 or a computer monitor. Those skilled in the art will appreciate that the signal can be decoded in or for a variety of equipment, including an CT, a computer, a TV, a monitor, or satellite dish. In an exemplary aspect, the methods and systems disclosed can be located within, or performed on, one or more CT's 120, TV's 121, central locations 101, DVR's, home theater PC's, and the like.

In an aspect, user location 200 is not fixed. By way of example, a user can receive content from the network 116 on a mobile device such as a laptop computer, PDA, smartphone, GPS, vehicle entertainment system, portable media player, and the like. There can be a multitude of user locations connected to network 116.

A service module 122 can be in communication with at least one of the user location 200, the network 116, and the central location 101 to provide analysis, management, and service functions to one or more user locations 200, the network 116, and the central location 101. In an aspect, the service module 122 can be configured to store and retrieve data from a storage device 124. It is understood that any storage device can be used such as a local storage device and a remote mass storage device, for example. As an example, the service module 122, which can be disposed at user location 200 or anywhere else in the network, can be configured to measure characteristics such as equalization coefficients and/or a transmit power levels of devices located at or associated with the user location 200. The service module 122 can be any data gathering device, including devices such as a tap, a multimedia terminal adapter (MTA), a cable or optical modem, interface devices, terminals, a set-top box, or any other media device in communication with the network 116. As a further example, the service module 122 can be located remotely from the user location 200 and can communicate with the devices at the user location 200 via the network 116 or a separate communications link. The service module 122 can also be portable and/or mobile.

In an aspect, the methods and systems can utilize digital audio/video compression such as MPEG, or any other type of compression. The Moving Pictures Experts Group (MPEG) was established by the International Standards Organization (ISO) for the purpose of creating standards for digital audio/video compression. The MPEG experts created the MPEG-1 and MPEG-2 standards, with the MPEG-1 standard being a subset of the MPEG-2 standard. The combined MPEG-1, MPEG-2, and MPEG-4 standards are hereinafter referred to as MPEG. In an MPEG encoded transmission, content and other data are transmitted in packets, which collectively make up a transport stream. Additional information regarding transport stream packets, the composition of the transport stream, types of MPEG tables, and other aspects of the MPEG standards are described below. In an exemplary embodiment, the present methods and systems can employ transmission of MPEG packets. However, the present methods and systems are not so limited, and can be implemented using other types of transmission and data.

As described in greater detail below, a network in communication with a user location can be analyzed using the systems and methods described herein. As an example, the network topology can comprise various components for processing and manipulating a signal.

Figure 2:
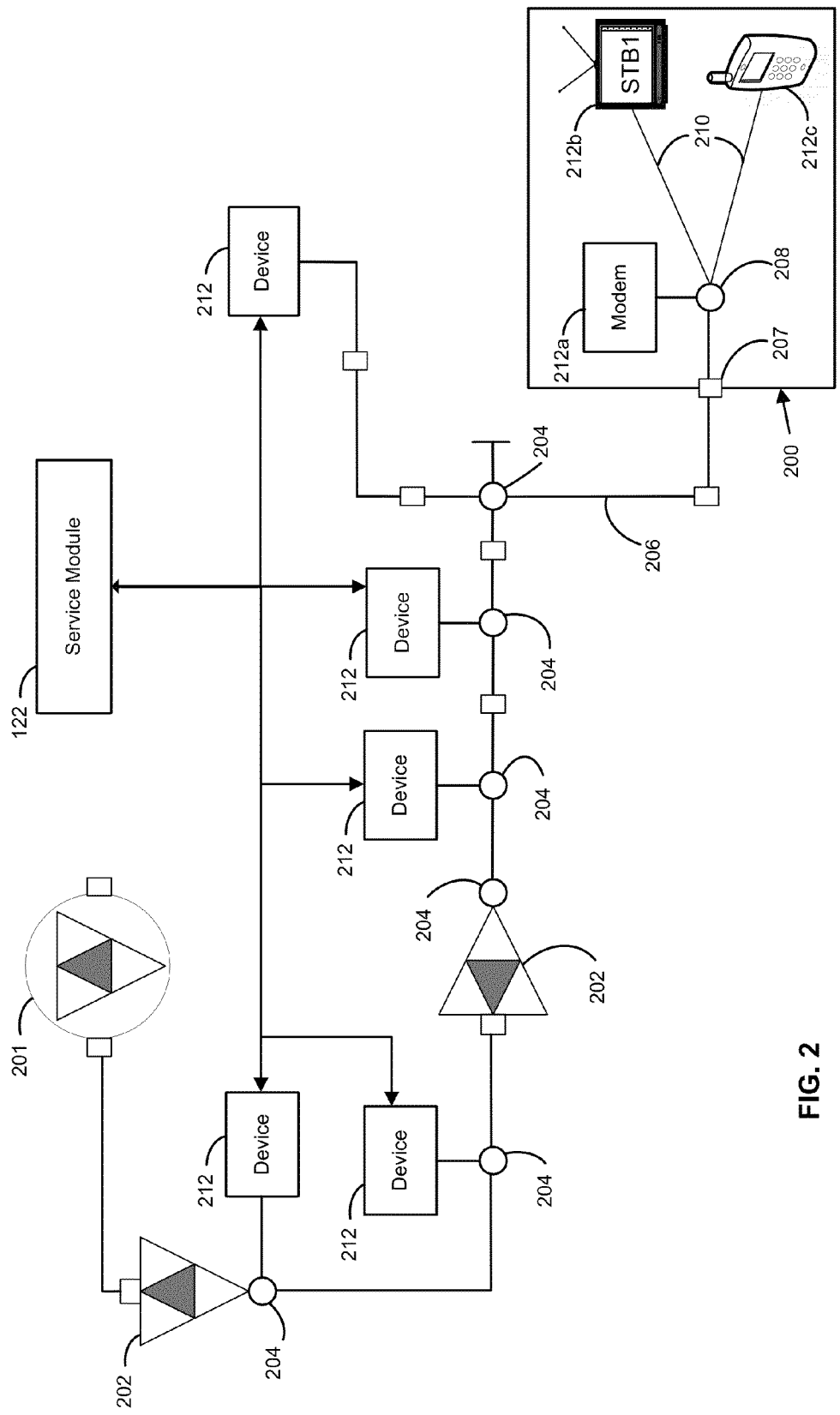
FIG. 2 is a block diagram of an exemplary network.

FIG. 2 illustrates an exemplary user location 200 in communication with a network, such as the network 116. In an aspect, a node 201 (e.g., fiber optic node, broadband optical receiver, converter, etc.) can transmit a signal from a source, such as from a device at the central location 101, to the user location 200. As shown, in one embodiment, one or more amplifiers 202 can be disposed in signal communication with the network 116 (e.g., via the node 201) to receive signals therefrom. In an aspect, the amplifier 202 can be a part of the network 116. Any number of the amplifiers 202 and other signal processing devices can be interposed between the network 116 and the user location 200. As an example, the amplifier 202 provides a pre-determined amplified signal to a downstream component (e.g., output from the amplifier 202). As an example, a value of the amplified signal can be about 17 dBmV. In an aspect, a value of the amplified input can be between 16-20 dBmV. However, other values having other variances can be used.

In an aspect, one or more taps 204 can be in signal communication with components of the network 116 (e.g., the amplifier 202, terminals, user devices, etc.). As an example, one or more of the taps 204 can receive a signal directly from the network 116. In an aspect, one or more of the taps 204 can provide an access point for "tapping" (e.g., accessing, capturing, analyzing, etc.) into the signals transmitted by the network 116 for the particular user location 200. It is further understood that any number of taps 204 can be used for particular applications, such as a multiple unit dwellings, business applications, office buildings, warehouses, etc.

In an aspect, an energy level (e.g., tap magnitude) presented at the tap(s) 204 can depend upon at least two factors, namely, the available signal energy at the tap 204 and a padding level (e.g., attenuation value of any pad, attenuator, coupler, or the like) of the tap 204. As an example, the padding level of the tap 204 can be adjusted by adding or removing attenuation devices such as pads, attenuators, and the like. However, other factors can be considered such as loss of signal power (e.g., insertion loss or through-put loss) resulting from the insertion of a device (e.g. the tap 204) in a transmission line or network. By way of example, the tap(s) 204 can be padded at 14, 20, 23, 26 or 29 dB below the signal level input in order to provide the proper signal attenuation to users who may be close or distant from a tap off unit and/or the central location 101. However, other padding levels and configurations can be used.

In an aspect, a drop line 206 (e.g., cable or wireless link) can be coupled to the tap 204 and routed into a physical structure such as the user's home or business to provide a flow path for the signals received from the network 116. In an aspect, a ground block 207 can be coupled to the drop line 206 downstream from the tap 204.

A plurality of premises lines 210, such as wireless links or cables, can be coupled to the first one of the splitters 208 to distribute the signals from the drop line 206 through the user location 200. In an aspect, each of the premises lines 210 can have an attenuation factor inherently associated therewith. For example, the following table provides exemplary attenuation values for particular lengths of the premises lines 210 as well as other devices that may be coupled to the premises lines 210.

| Component | Typical Attenuation |
|---|---|
| 100' RG6 coaxial | −1.25 dBmV |
| DOCSIS Equalizer (NMTER = 1): | −1 dBmV |
| In-Home Amplifier | −1 dBmV |

It is understood that any premises lines, cables, wireless links or the like having any attenuation can be used without departing from the spirit of the present disclosure. One skilled in the art will understand that various configurations of the premises lines 210 can be used to support the distribution requirements of any particular location or premises.

In an aspect, other splitters 208 or devices 212 can be coupled to the premises lines 210 to receive the signals therefrom. Accordingly, the devices 212 in the user location 200 can be connected to the network 116 through the tap 204. As an example, the connected devices 212 can include a modem 212a, a terminal such as a set-top box (STB) 212b, a mobile device such as a smart phone 212c, or other device in communication with the tap 204. As a further example, the devices 212 can include user devices and systems configured to receive signals from at least one of the network 116 and the central location 101. It is understood that the configuration and interconnection of at least the splitters 208, the premises lines 210, and the devices 212 can represent a network topology for the particular user location 200.

The service module 122 can be in communication with at least one of the taps 204, the user location 200, the network 116, and the central location 101 to provide analysis, management, and service functions to one or more user locations 200, the network 116, and the central location 101. As an example, the service module 122 can be configured to measure characteristics such as equalization coefficients and/or a transmit power of devices located at, or associated with, the user location 200, including devices such as tap 204, a multimedia terminal adapter (MTA), a cable or optical modem, interface devices, terminals, a set-top box, or any other media device in communication with the network 116. As a further example, the service module 122 can interrogate devices (e.g., devices 212, DOCSIS devices, etc.) on a common channel for downstream equalization coefficient data. Further, the service module can analyze the retrieved coefficient data to assess service quality, as described in further detail below.

Figure 3:
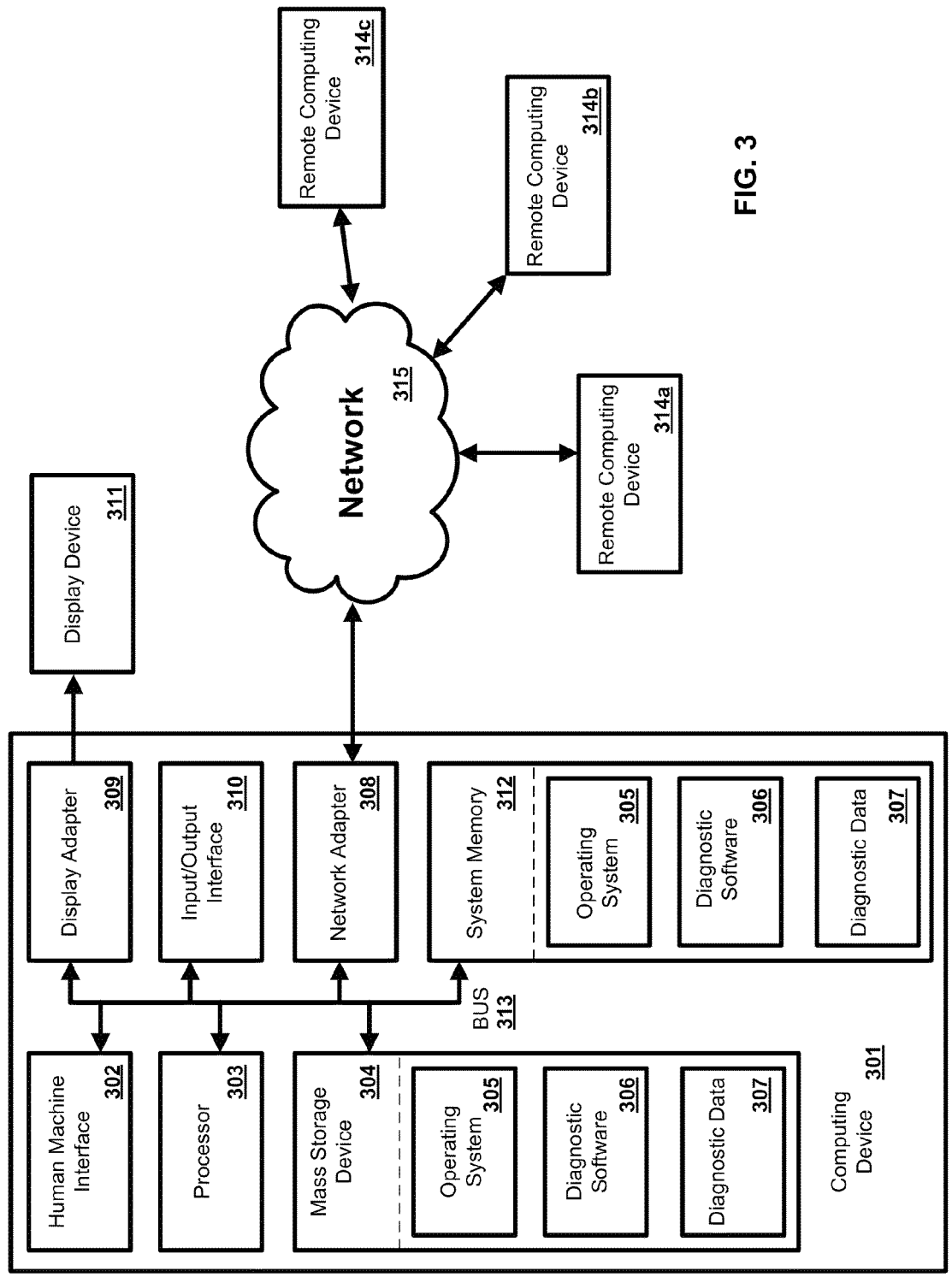
FIG. 3 is a block diagram of an exemplary computing device.

In an exemplary aspect, the methods and systems can be implemented on a computing device such as a computer 301 as illustrated in FIG. 3 and described below. One skilled in the art will appreciate that this is a functional description and that the respective functions can be performed by software, hardware, or a combination of software and hardware. By way of example, service module 124 of FIG. 1 can be a computer as illustrated in FIG. 3. Similarly, the methods and systems disclosed can utilize one or more computers to perform one or more functions in one or more locations. FIG. 3 is a block diagram illustrating an exemplary operating environment for performing the disclosed methods. This exemplary operating environment is only an example of an operating environment and is not intended to suggest any limitation as to the scope of use or functionality of operating environment architecture. Neither should the operating environment be interpreted as having any dependency or requirement relating to any one or combination of components illustrated in the exemplary operating environment.

The present methods and systems can be operational with numerous other general purpose or special purpose computing system environments or configurations. Examples of well known computing systems, environments, and/or configurations that can be suitable for use with the systems and methods comprise, but are not limited to, personal computers, server computers, laptop devices, and multiprocessor systems. Additional examples comprise set top boxes, programmable consumer electronics, network PCs, minicomputers, mainframe computers, distributed computing environments that comprise any of the above systems or devices, and the like.

The processing of the disclosed methods and systems can be performed by software components. The disclosed systems and methods can be described in the general context of computer-executable instructions, such as program modules, being executed by one or more computers or other devices. Generally, program modules comprise computer code, routines, programs, objects, components, data structures, etc. that perform particular tasks or implement particular abstract data types. The disclosed methods can also be practiced in grid-based and distributed computing environments where tasks are performed by remote processing devices that are linked through a communications network. In a distributed computing environment, program modules can be located in both local and remote computer storage media including memory storage devices.

Further, one skilled in the art will appreciate that the systems and methods disclosed herein can be implemented via a general-purpose computing device in the form of a computer 301. The components of the computer 301 can comprise, but are not limited to, one or more processors or processing units 303, a system memory 312, and a system bus 313 that couples various system components including the processor 303 to the system memory 312. In the case of multiple processing units 303, the system can utilize parallel computing.

The system bus 313 represents one or more of several possible types of bus structures, including a memory bus or memory controller, a peripheral bus, an accelerated graphics port, and a processor or local bus using any of a variety of bus architectures. By way of example, such architectures can comprise an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, and a Peripheral Component Interconnects (PCI), a PCI-Express bus, a Personal Computer Memory Card Industry Association (PCMCIA), Universal Serial Bus (USB) and the like. The bus 313, and all buses specified in this description can also be implemented over a wired or wireless network connection and each of the subsystems, including the processor 303, a mass storage device 304, an operating system 305, diagnostic software 306, a diagnostic data 307, a network adapter 308, system memory 312, an Input/Output Interface 310, a display adapter 309, a display device 311, and a human machine interface 302, can be contained within one or more remote computing devices 314a,b,c at physically separate locations, connected through buses of this form, in effect implementing a fully distributed system.

The computer 301 typically comprises a variety of computer readable media. Exemplary readable media can be any available media that is accessible by the computer 301 and comprises, for example and not meant to be limiting, both volatile and non-volatile media, removable and non-removable media. The system memory 312 comprises computer readable media in the form of volatile memory, such as random access memory (RAM), and/or non-volatile memory, such as read only memory (ROM). The system memory 312 typically contains data such as diagnostic data 307 and/or program modules such as operating system 305 and diagnostic software 306 that are immediately accessible to and/or are presently operated on by the processing unit 303.

In another aspect, the computer 301 can also comprise other removable/non-removable, volatile/non-volatile computer storage media. By way of example, FIG. 3 illustrates a mass storage device 304 which can provide non-volatile storage of computer code, computer readable instructions, data structures, program modules, and other data for the computer 301. For example and not meant to be limiting, a mass storage device 304 can be a hard disk, a removable magnetic disk, a removable optical disk, magnetic cassettes or other magnetic storage devices, flash memory cards, CD-ROM, digital versatile disks (DVD) or other optical storage, random access memories (RAM), read only memories (ROM), electrically erasable programmable read-only memory (EEPROM), and the like.

Optionally, any number of program modules can be stored on the mass storage device 304, including by way of example, an operating system 305 and diagnostic software 306. Each of the operating system 305 and diagnostic software 306 (or some combination thereof) can comprise elements of the programming and the diagnostic software 306. Diagnostic data 307 can also be stored on the mass storage device 304. Diagnostic data 307 can be stored in any of one or more databases known in the art. Examples of such databases comprise, DB2®, Microsoft® Access, Microsoft® SQL Server, Oracle®, mySQL, PostgreSQL, and the like. The databases can be centralized or distributed across multiple systems.

In another aspect, the user can enter commands and information into the computer 301 via an input device (not shown). Examples of such input devices comprise, but are not limited to, a keyboard, pointing device (e.g., a "mouse"), a microphone, a joystick, a scanner, tactile input devices such as gloves, and other body coverings, and the like. These and other input devices can be connected to the processing unit 303 via a human machine interface 302 that is coupled to the system bus 313, but can be connected by other interface and bus structures, such as a parallel port, game port, an IEEE 1394 Port (also known as a Firewire port), a serial port, or a universal serial bus (USB).

In yet another aspect, a display device 311 can also be connected to the system bus 313 via an interface, such as a display adapter 309. It is contemplated that the computer 301 can have more than one display adapter 309 and the computer 301 can have more than one display device 311. For example, a display device can be a monitor, an LCD (Liquid Crystal Display), or a projector. In addition to the display device 311, other output peripheral devices can comprise components such as speakers (not shown) and a printer (not shown) which can be connected to the computer 301 via Input/Output Interface 310. Any step and/or result of the methods can be output in any form to an output device. Such output can be any form of visual representation, including, but not limited to, textual, graphical, animation, audio, tactile, and the like. The display 311 and computer 301 can be part of one device, or separate devices.

The computer 301 can operate in a networked environment using logical connections to one or more remote computing devices 314a,b,c. By way of example, a remote computing device can be a personal computer, portable computer, smartphone, a server, a router, a network computer, a peer device or other common network node, and so on. Logical connections between the computer 301 and a remote computing device 314a,b,c can be made via a network 315, such as a local area network (LAN) and a general wide area network (WAN). Such network connections can be through a network adapter 308. A network adapter 308 can be implemented in both wired and wireless environments. Such networking environments are conventional and commonplace in dwellings, offices, enterprise-wide computer networks, intranets, and the Internet.

For purposes of illustration, application programs and other executable program components such as the operating system 305 are illustrated herein as discrete blocks, although it is recognized that such programs and components reside at various times in different storage components of the computing device 301, and are executed by the data processor(s) of the computer. An implementation of diagnostic software 306 can be stored on or transmitted across some form of computer readable media. Any of the disclosed methods can be performed by computer readable instructions embodied on computer readable media. Computer readable media can be any available media that can be accessed by a computer. By way of example and not meant to be limiting, computer readable media can comprise "computer storage media" and "communications media." "Computer storage media" comprise volatile and non-volatile, removable and non-removable media implemented in any methods or technology for storage of information such as computer readable instructions, data structures, program modules, or other data. Exemplary computer storage media comprises, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

The methods and systems can employ Artificial Intelligence techniques such as machine learning and iterative learning. Examples of such techniques include, but are not limited to, expert systems, case based reasoning, Bayesian networks, behavior based AI, neural networks, fuzzy systems, evolutionary computation (e.g. genetic algorithms), swarm intelligence (e.g. ant algorithms), and hybrid intelligent systems (e.g. Expert inference rules generated through a neural network or production rules from statistical learning).

As described in greater detail below, provided are methods for determining/inferring a network topology for a particular user location. As an example, the network topology can identify an interconnection of various components for processing, routing, and/or manipulating a signal.

Figure 4:
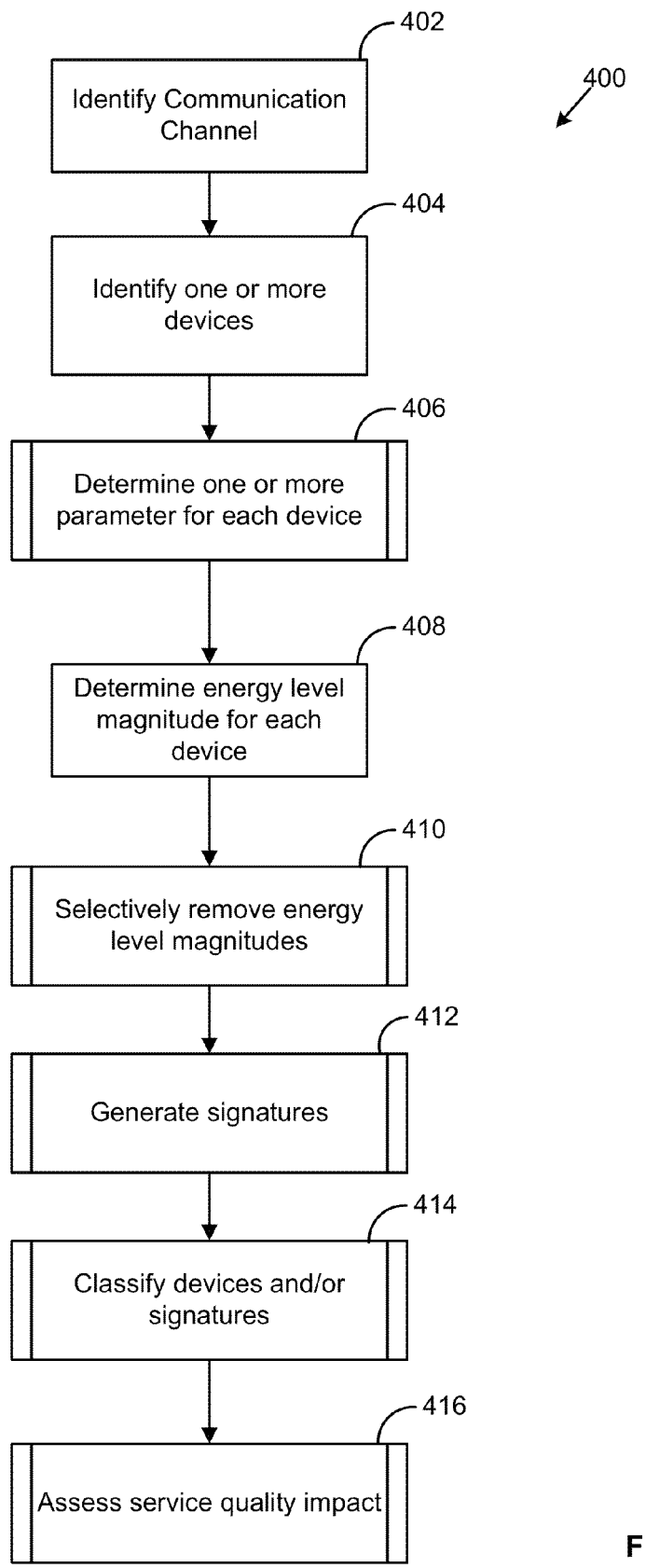
FIG. 4 is a flow chart of an exemplary method.

FIG. 4 illustrates a method 400 for analyzing a network. The method illustrated in FIG. 4 will be discussed in reference to FIGS. 1-3, for example, but is not so limited. In step 402, a communication channel can be determined. As an example, one or more communication channels can be distinguished and identified based on a frequency and/or modulation. Accordingly, a channel or channels can be determined based upon a selection of a particular identifier. As a further example, one or more communication channels can be determined based a grouping or classification of devices receiving signals on a particular channel. In an aspect, a channel can be determined by selecting a particular channel servicing a particular device or devices. As an example, channel grouping can be ascertained from network management systems, devices, or external inventory systems.

In step 404, user/customer hardware including devices 212 can be determined based upon the unique key/identifier. As an example, a database of the hardware assigned to, or associated with, any number of user locations 200 (e.g., by a provider) can be accessed to retrieve an equipment list. Also, devices added to a home network by a user can be identified via user registration or other discovery techniques or tools. As a further example, the hardware can be identified in real-time by an on-site technician or by remote means. It is understood that the hardware can comprise any number of devices such as the devices 212, and/or any other user devices or devices provided by an operator or service provider.

In step 406, user/customer hardware (e.g., devices 212) can be interrogated or queried for at least one or more of an upstream transmit power, an equalization coefficient, and a high-resolution timing offset value. As an example, the service module 124 can communicate with each of the devices 212 in order to measure or retrieve the at least one or more of the upstream transmit power, the equalization coefficient, and the high-resolution timing offset value. As a further example, the devices 212 can be queried locally by an individual at the user location 200. In an aspect, previously collected data may be retrieved in place of a direct query of the devices 212.

Figure 5A:
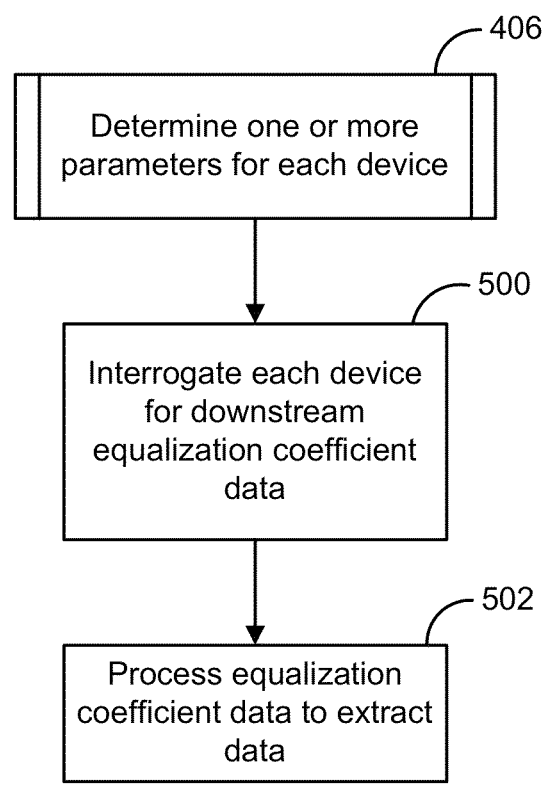
FIG. 5A is a flow chart of an exemplary method.

As illustrated in FIG. 5A, one or more devices 212 on a common channel can be interrogated for downstream equalization coefficient data, at step 500. As an illustrative example, sample equalization coefficient data for six modems is shown in FIG. 5B. In step 502, the equalization coefficient data can be processed to extract one or more data points such as optional header information and real and/or imaginary complex coefficient values (e.g., expressed as hffe/hdfe assuming only feed-forward equalization (ffe) tap structure). As an example, extracted data points can comprise decision feedback equalization (DFE) (e.g., in a ffe/dfe equalizer). As an illustrative example, sample extracted equalization coefficient data points for six modems are shown in FIG. 5C.

Returning to FIG. 4, in step 408 an energy level can be determined for one or more devices or taps. As an example, the energy level can be a decision feedback equalization (DFE) energy level based on the equalization coefficient data or based on the extracted data points collected in step 406 (e.g., illustrated in FIG. 6B). As a further example the energy level can be determined based on the following formula:

$$20*\log 10(\mathrm{hdfe}[re]/\sqrt{\mathrm{sum}(\mathrm{hdfe}[re2+im2])}),$$

wherein the formula is based on a standard conversion of energy to decibel dB=10 log 10(P1/P2), where p1 is the first real value hdfe[re] based upon decision feedback equalization data and p2 is the square root of the sums of a second real value hdfe[re2] based upon decision feedback equalization data and a second imaginary value hdfe[im2] based upon decision feedback equalization data.

In step 410, one or more of the energy levels can be selectively removed. As an example, the selective removal of certain energy levels or ranges of magnitudes can isolate in-home or near-home impairments or problems from further-out problems.

Figure 6A:
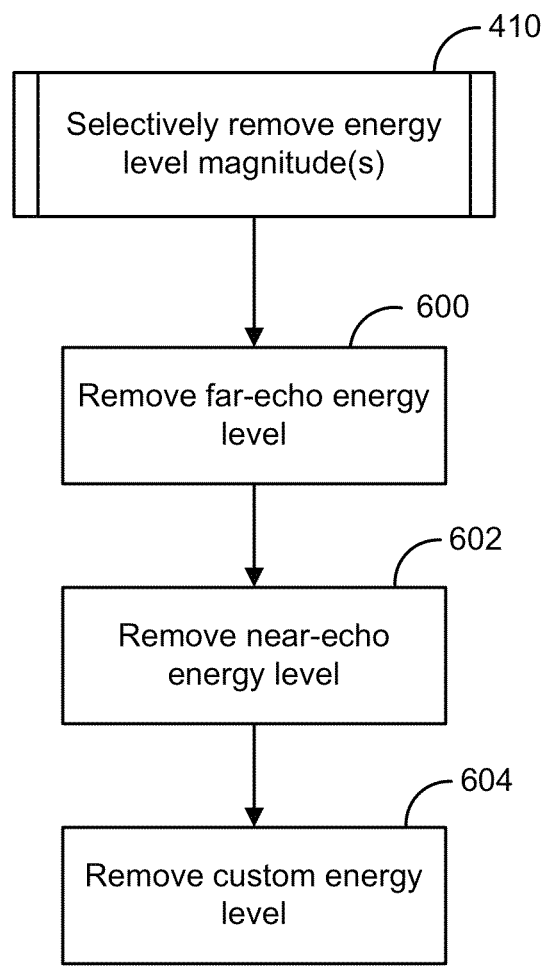
FIG. 6A is a flow chart of an exemplary method.
Figure 6B:
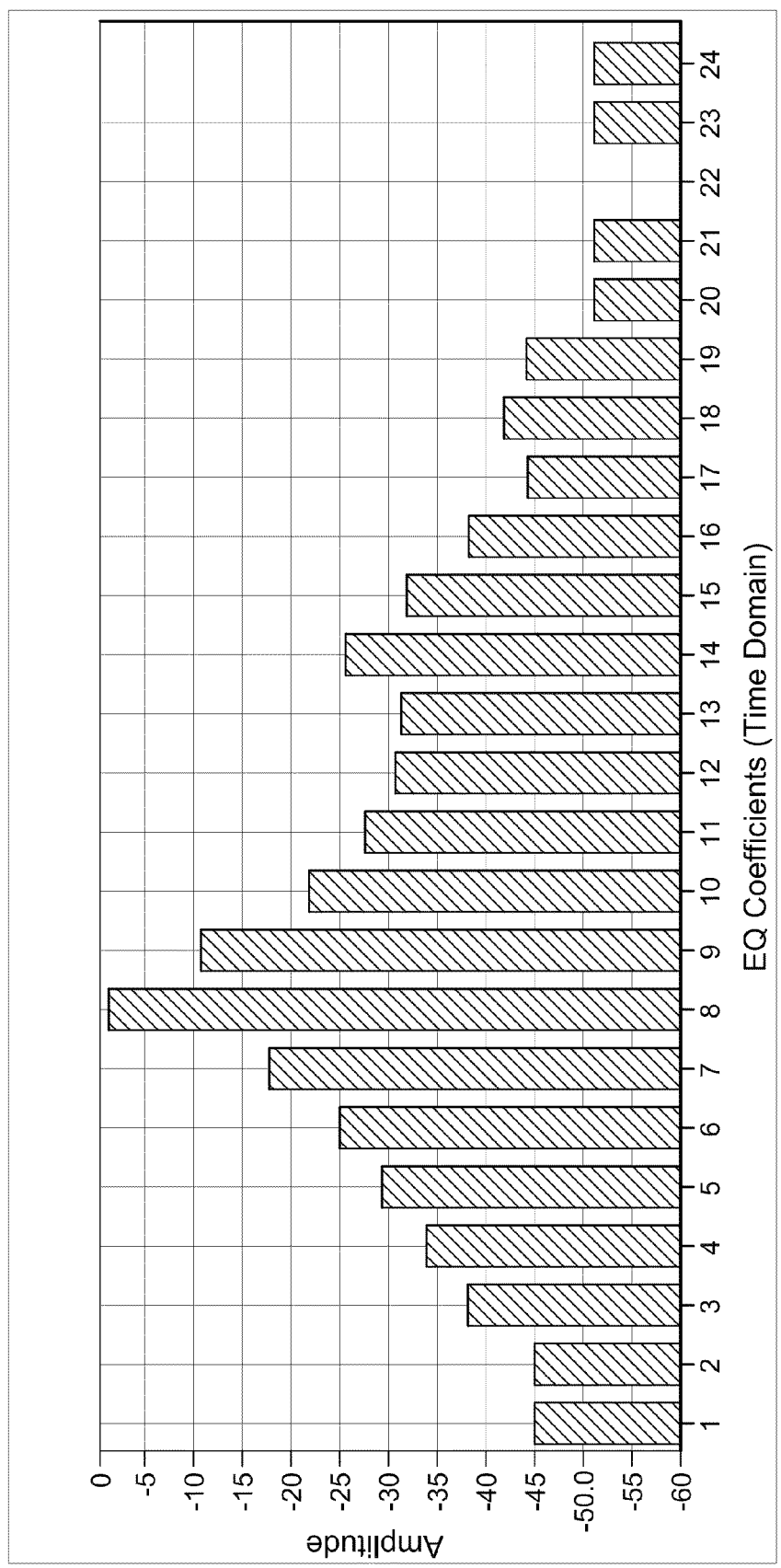
FIG. 6B is a chart of exemplary energy levels.
Figure 6C:
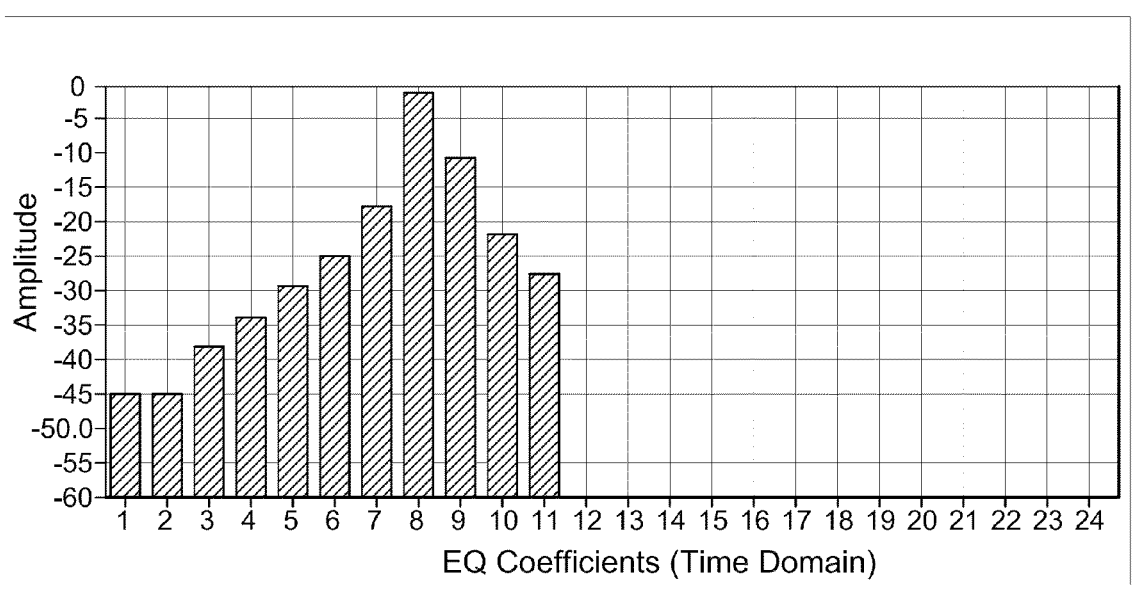
FIG. 6C is a chart of exemplary energy levels.
Figure 6D:
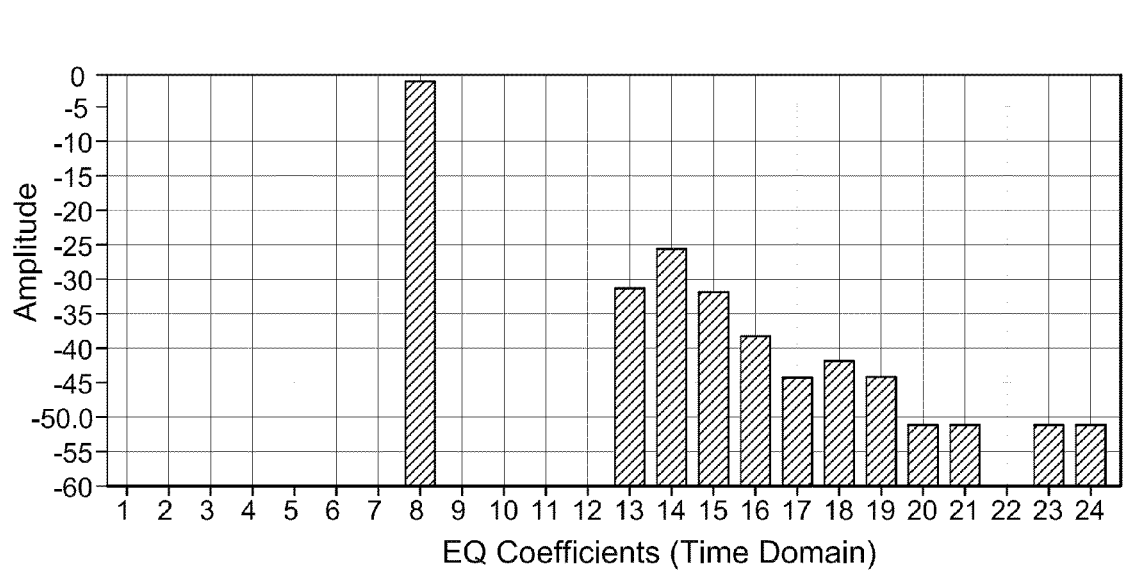
FIG. 6D is a chart of exemplary energy levels.

FIG. 6A illustrates an exemplary method of selectively removing determined energy levels (e.g., equalization taps, tap magnitudes) from an analysis group or subset. In step 600, energy levels determined for far-echo taps can be removed from the analysis group, as illustrated in FIG. 6C. For example, energy levels determined for far-echo taps 12-24 can be removed to minimize the contribution of problems in the plant and focus on in-home and/or drop line energy levels. In step 602, energy levels determined for near-echo taps can be removed from the analysis group, as illustrated in FIG. 6D. As an example, energy levels for Near-echo taps 1-7, 9-12, can be removed from the analysis group to minimize the contribution of in-home and/or drop and to focus on problems in the plant. In step 604, one or more equalization taps can be removed based upon a rule, decision engine, predetermined instruction set, filter for known issues, or customized method or technique. As an example, energy levels can be removed to limit noise from contributing problems in order to focus on other sources of system issues.

Returning to FIG. 4, in step 412, signatures can be generated from the energy levels. As an example, the remaining energy levels or energy levels can be converted to generate waveform signatures. As a further example, the energy levels can be converted from time domain input to the frequency domain.

Figure 7A:
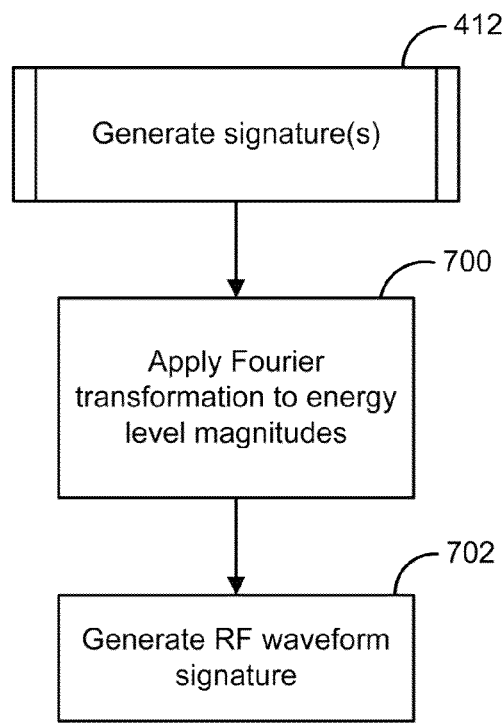
FIG. 7A is a flow chart of an exemplary method.
Figure 7B:
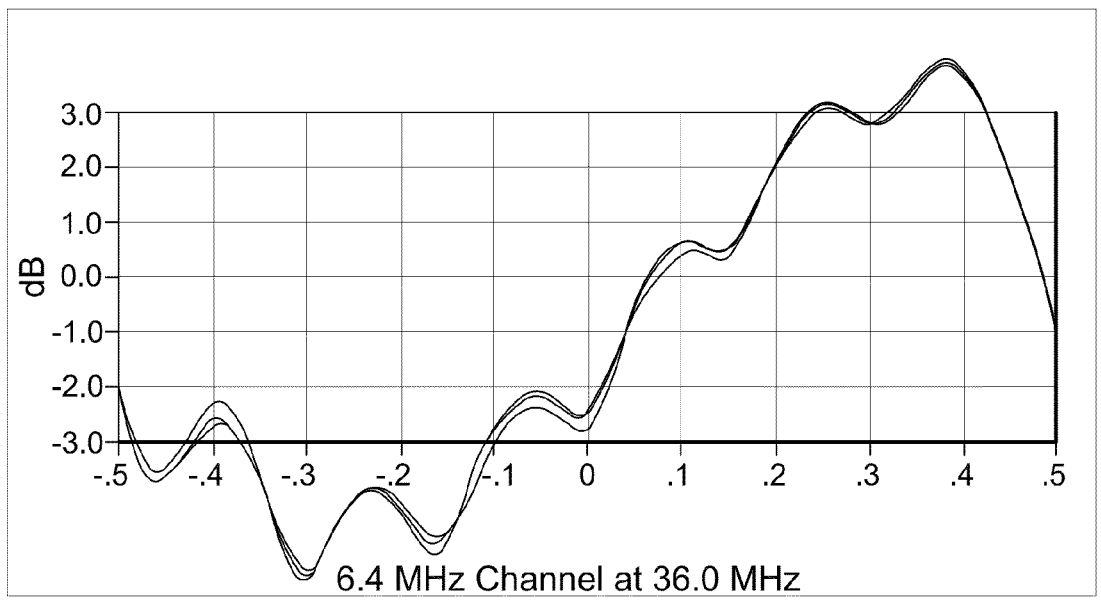
FIG. 7B is a graph of exemplary energy levels.
Figure 7C:
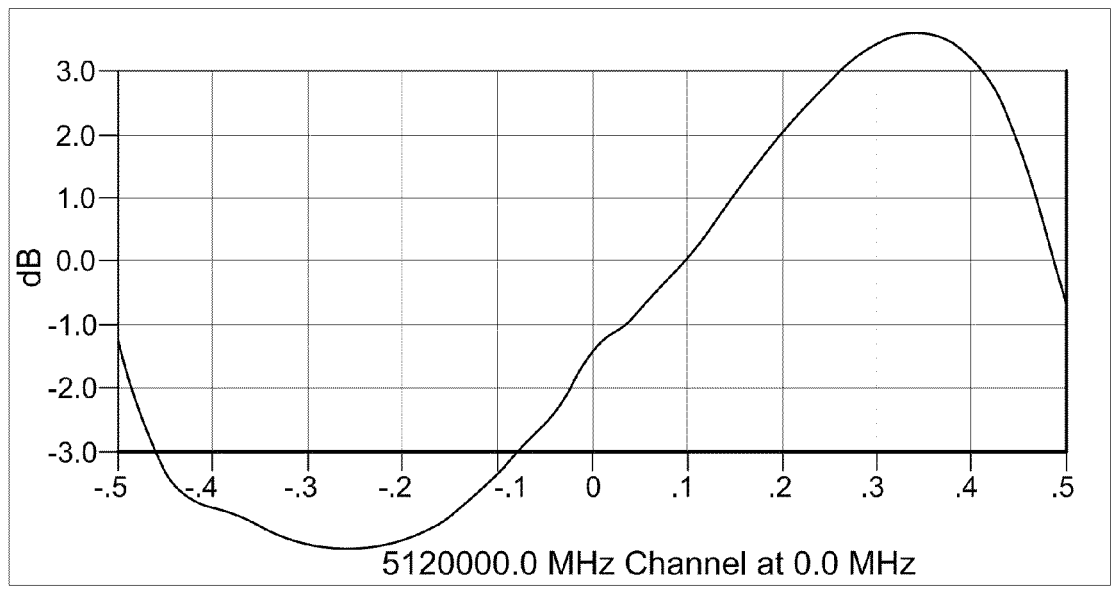
FIG. 7C is a graph of an exemplary energy level.
Figure 7D:
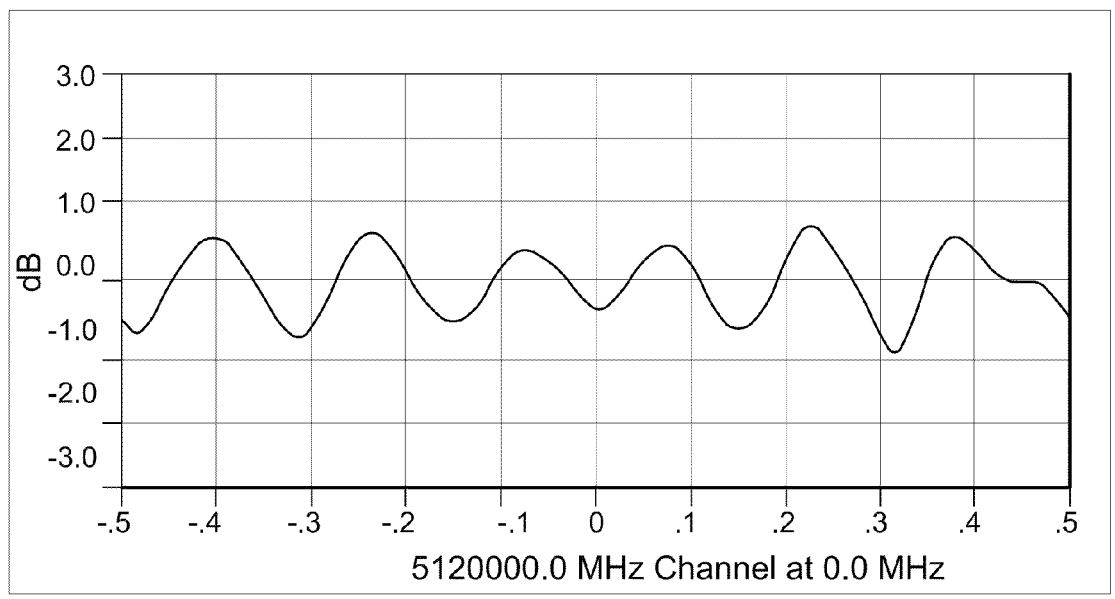
FIG. 7D is a graph of an exemplary energy level.

In an aspect, FIG. 7A illustrates, a method of converting energy levels from the time domain to the frequency domain. In step, 700, a Fourier transformation can be applied to the energy levels in the analysis subset (e.g., energy levels that have not been removed in steps 600-604). In step 702, one or more waveform signatures can be generated from the result of Fourier transformation. As an illustrative example, FIGS. 7B-7D illustrate a Fourier transform of energy levels from time domain to frequency domain, thereby generating a waveform signature (FIG. 7D). As an example, equalization coefficients may be parsed, normalized, and analyzed using Fourier transformation to derive amplitude and phase components. The amplitude and phase components can be derived from a time domain representation, which can be used to synthesize or approximate a symbol placement in connection with a transmission scheme. For example, in the context of conveying symbols using quadrature amplitude modulation, such as 64-QAM, every bit pattern corresponding to the sixty-four (64) possible symbols can be synthesized. Multiple (e.g., a number 'n') iterations can be conducted to achieve a (Gaussian) scatter. Such techniques may be applied with respect to a single communication channel (e.g., in relation to communications from a first device, such as a user terminal, and a second device, such as a terminal server or TS). The techniques may also be applied across a plurality of communication channels or devices (e.g., multiple user terminals in communication with one or more other devices, such as a terminal server or TS). For example, an in-home service repairman or installer may be interested in the channel characteristics associated with a particular user terminal, whereas a line operator may be more concerned with the performance of all (or a subset of) the user terminals in the communication system.

Returning to FIG. 4, in step 414 user/customer hardware (e.g., devices 212) can be classified based on an associated signature. In an example, each of the devices 212 interrogated in step 404 can be classified. As a further example, the signatures (e.g., representing devices and/or taps) generated in step 412 can be processed and classified. As such, the hardware associated with the classified signatures can be respectively classified based upon the signature classification.

Figure 8A:
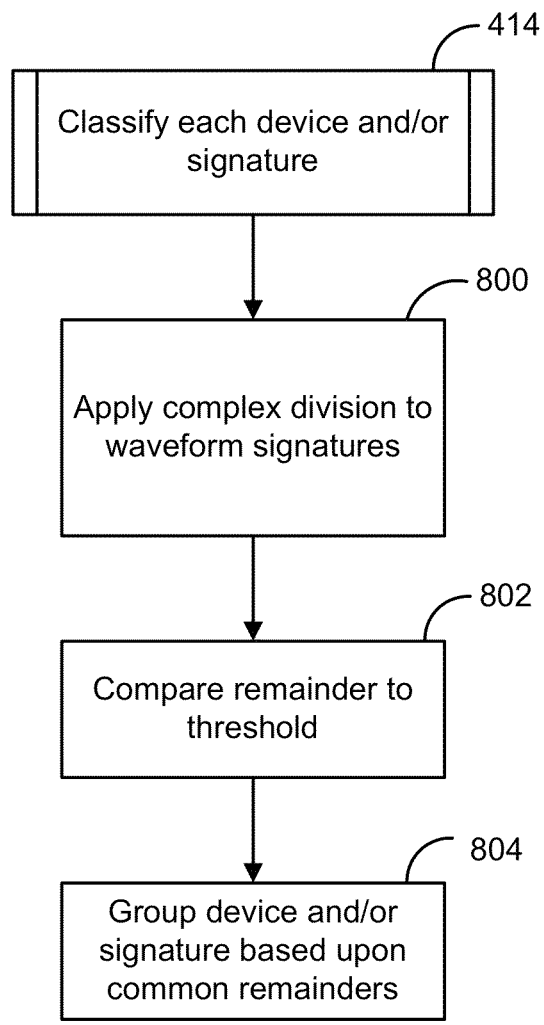
FIG. 8A is a flow chart of an exemplary method.

FIG. 8A illustrates an exemplary method of classifying devices based upon waveform signatures. In an aspect, the waveform signatures can be recursively grouped based on a best fit of the results of complex division. For example, in step 800, for a pair of two waveform signatures $\{s_i, s_j\}$ where $i>j$, $s_i$ can be divided by $s_j$, thereby resulting in a remainder waveform representative of a ratio of $s_i$ and $s_j$. In step, 802, the ratio or remainder waveform can be compared to a threshold and/or comparator. If the ratio is within the threshold (e.g., the remainder waveform does not exceed a predetermined amplitude, the ratio is representative of a pre-determined percentage match between the compared waveforms, etc.) the pair waveform signatures $\{s_i, s_j\}$ can be classified as a match and can define a group of two, at step 804. In an aspect, any signature can be processed in a similar manner and recursively grouped with common members, thereby forming larger groups of associated signatures. As an example, the grouping process can be terminated when no signature waveform is a member of more than one group. Accordingly, the members of the resulting groups share common sets of impairments, which are located nearby and/or upstream of the members of the group.

Figure 8B:
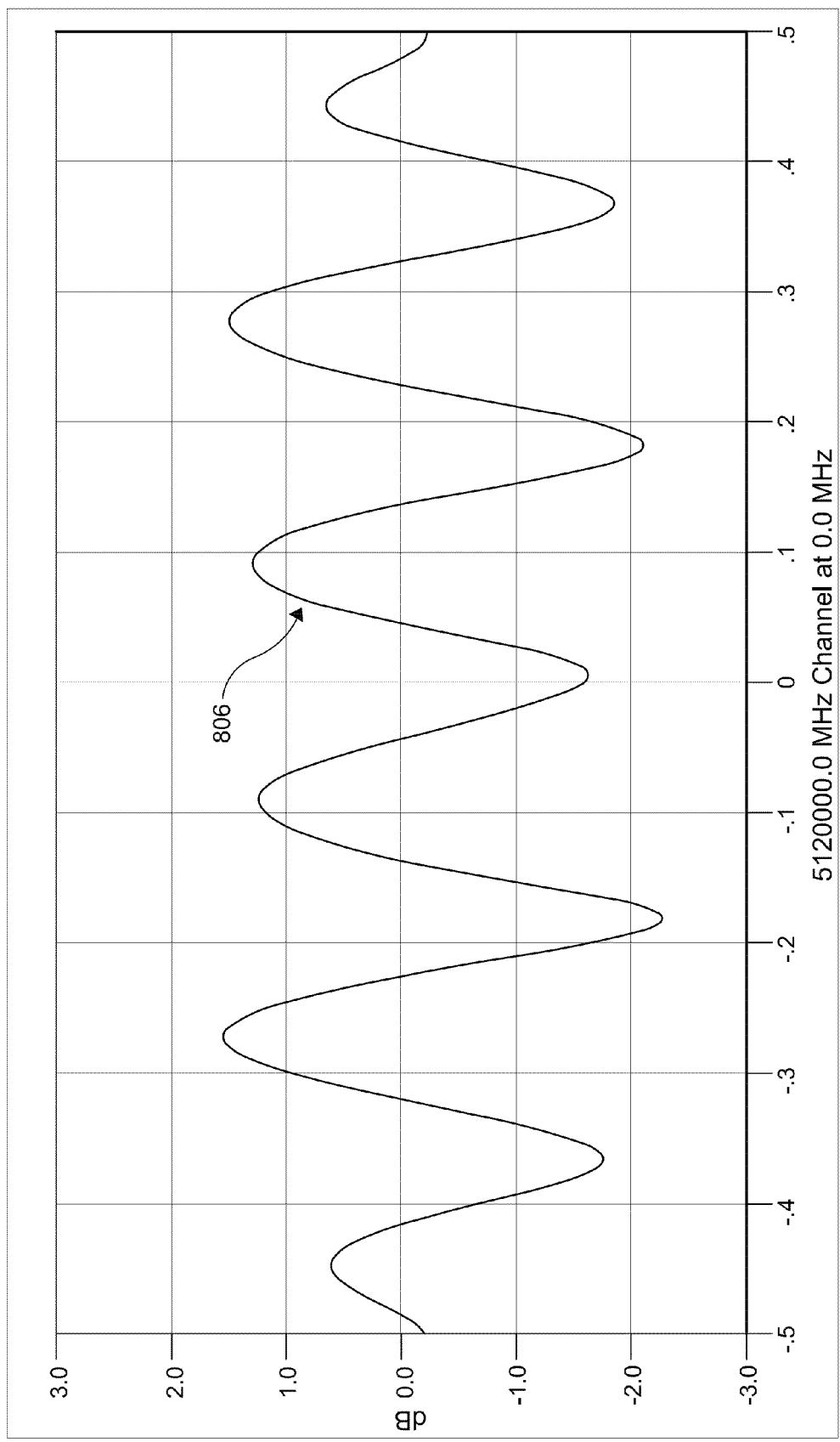
FIG. 8B is a graph of an exemplary signature waveform.
Figure 8D:
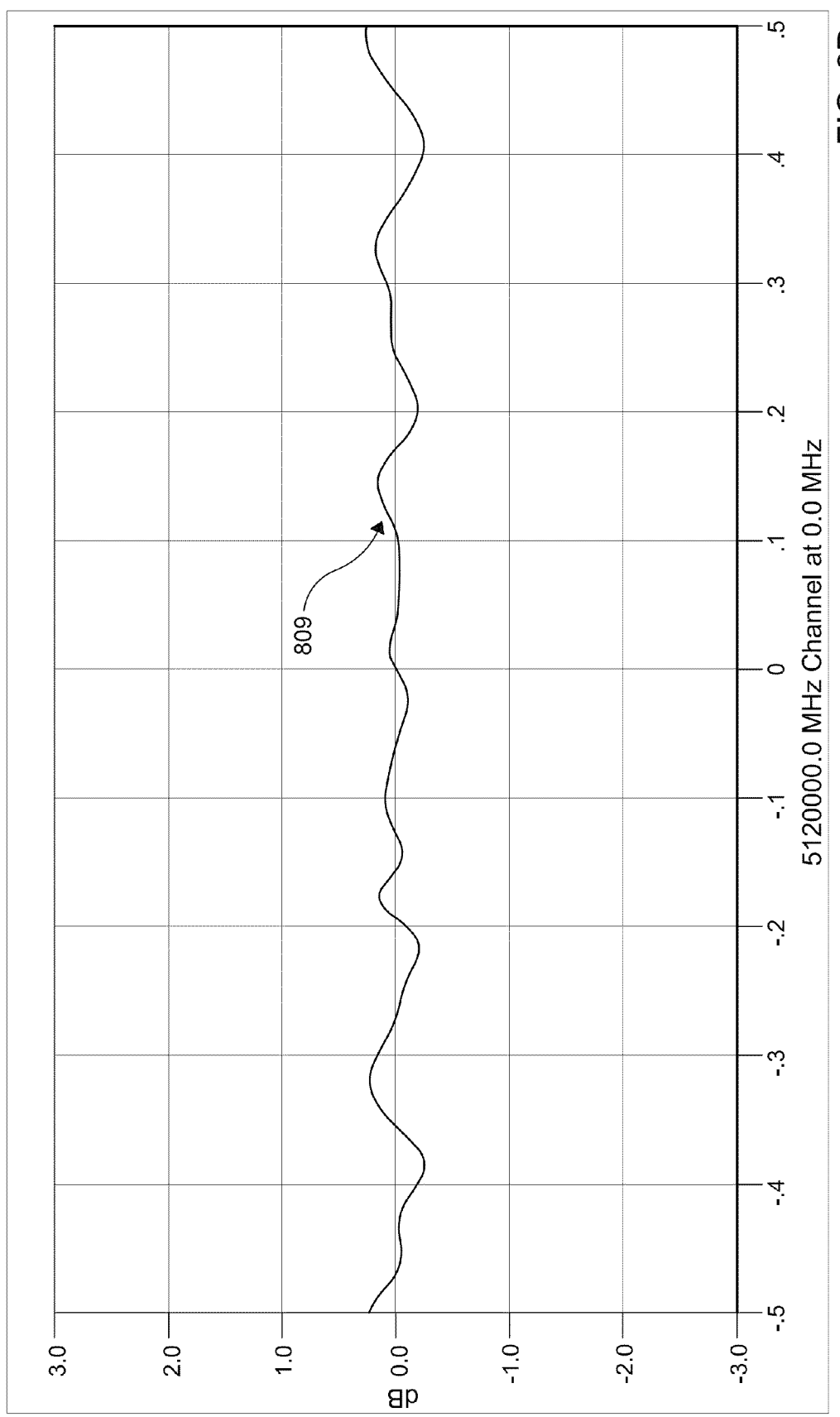
FIG. 8D is a graph of an exemplary result of complex division.

FIGS. 8B-8F provide an illustrative example of the method described in FIG. 8A. As an example, FIG. 8B illustrates a signature waveform 806 in the frequency domain. FIG. 8C illustrates another signature waveform 808 in the frequency domain. FIG. 8D illustrates a result of division of signature waveform 806 by signature waveform 808. As an example, the result of division illustrated in FIG. 8D can be compared to a threshold or comparator (e.g., the remainder waveform does not exceed a predetermined amplitude, the ratio is representative of a pre-determined percentage match between the compared waveforms, etc.). As a further example, the result of the division illustrated in FIG. 8D can be within a pre-determined threshold, thereby indicating that signature waveform 806 and signature waveform 808 should be grouped together in a common grouping.

Figure 8E:
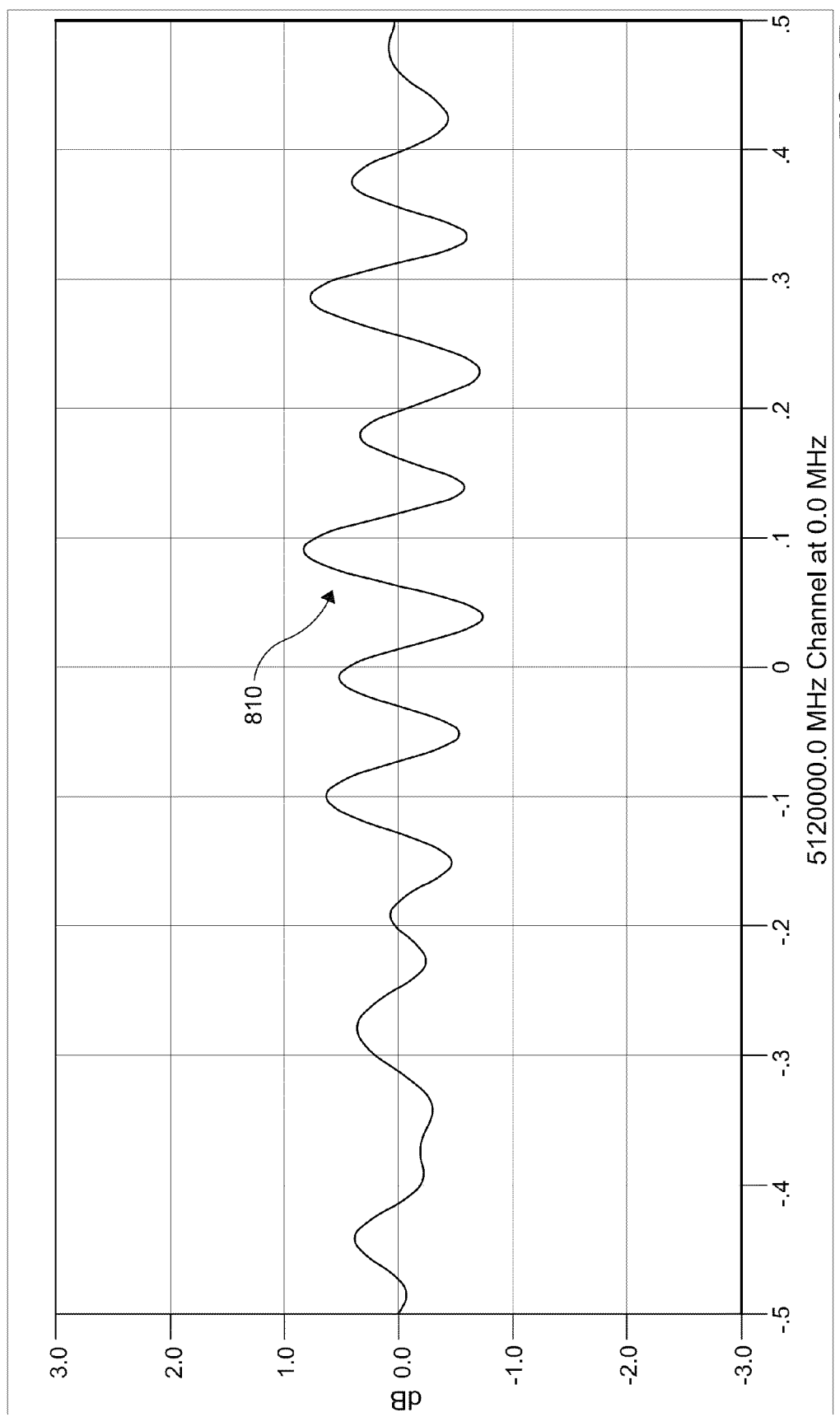
FIG. 8E is a graph of an exemplary signature waveform.
Figure 8F:
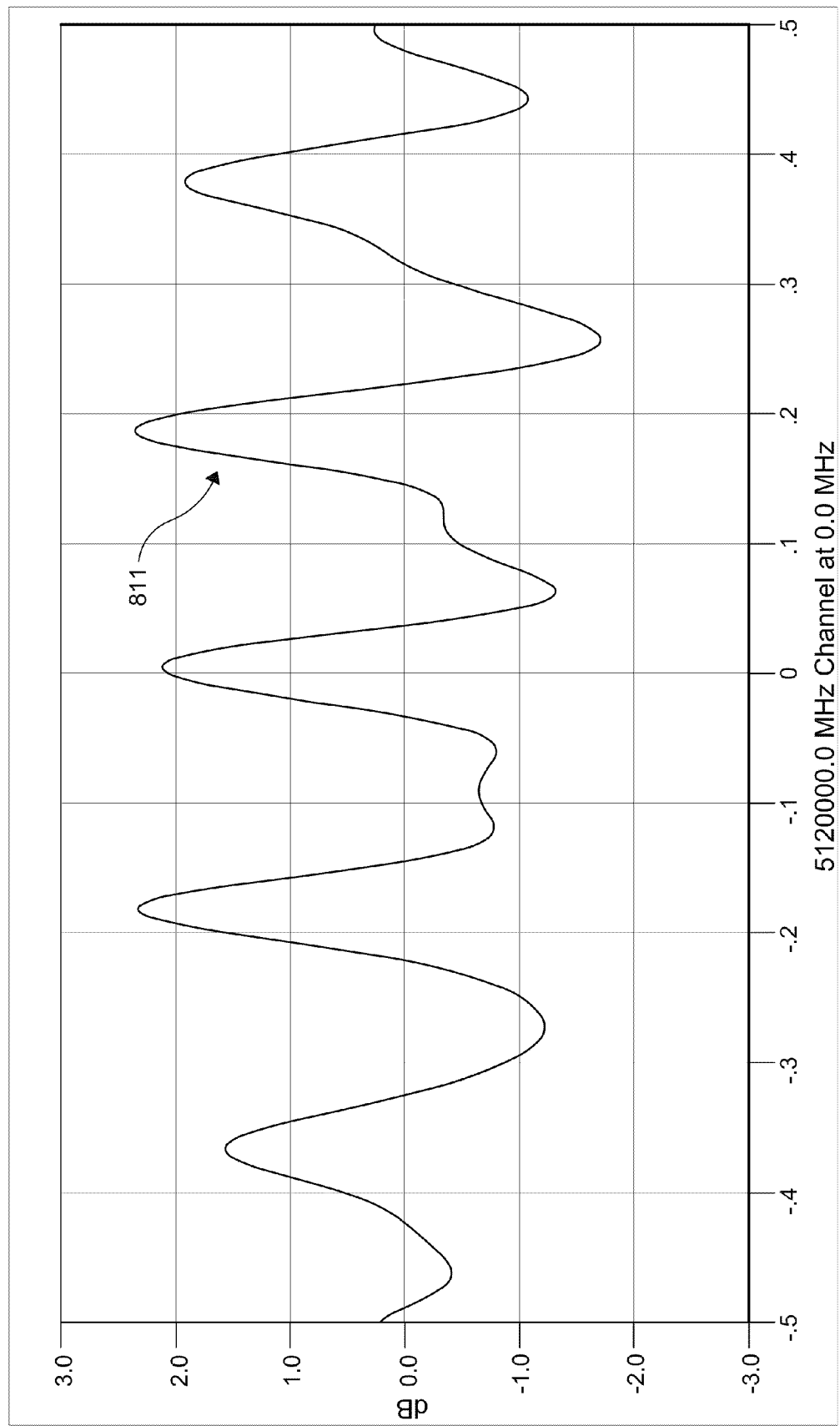
FIG. 8F is a graph of an exemplary result of complex division.

FIG. 8E illustrates a signature waveform 810 in the frequency domain. FIG. 8F illustrates a result of division of signature waveform 806 by signature waveform 810. As an example, the result of division illustrated in FIG. 8F can be compared to a threshold or comparator (e.g., the remainder waveform does not exceed a predetermined amplitude, the ratio is representative of a pre-determined percentage match between the compared waveforms, etc.). As a further example, the result of the division illustrated in FIG. 8F can be outside the pre-determined threshold, thereby indicating that signature waveform 806 and signature waveform 808 should not be grouped together in a common grouping.

Figure 8H:
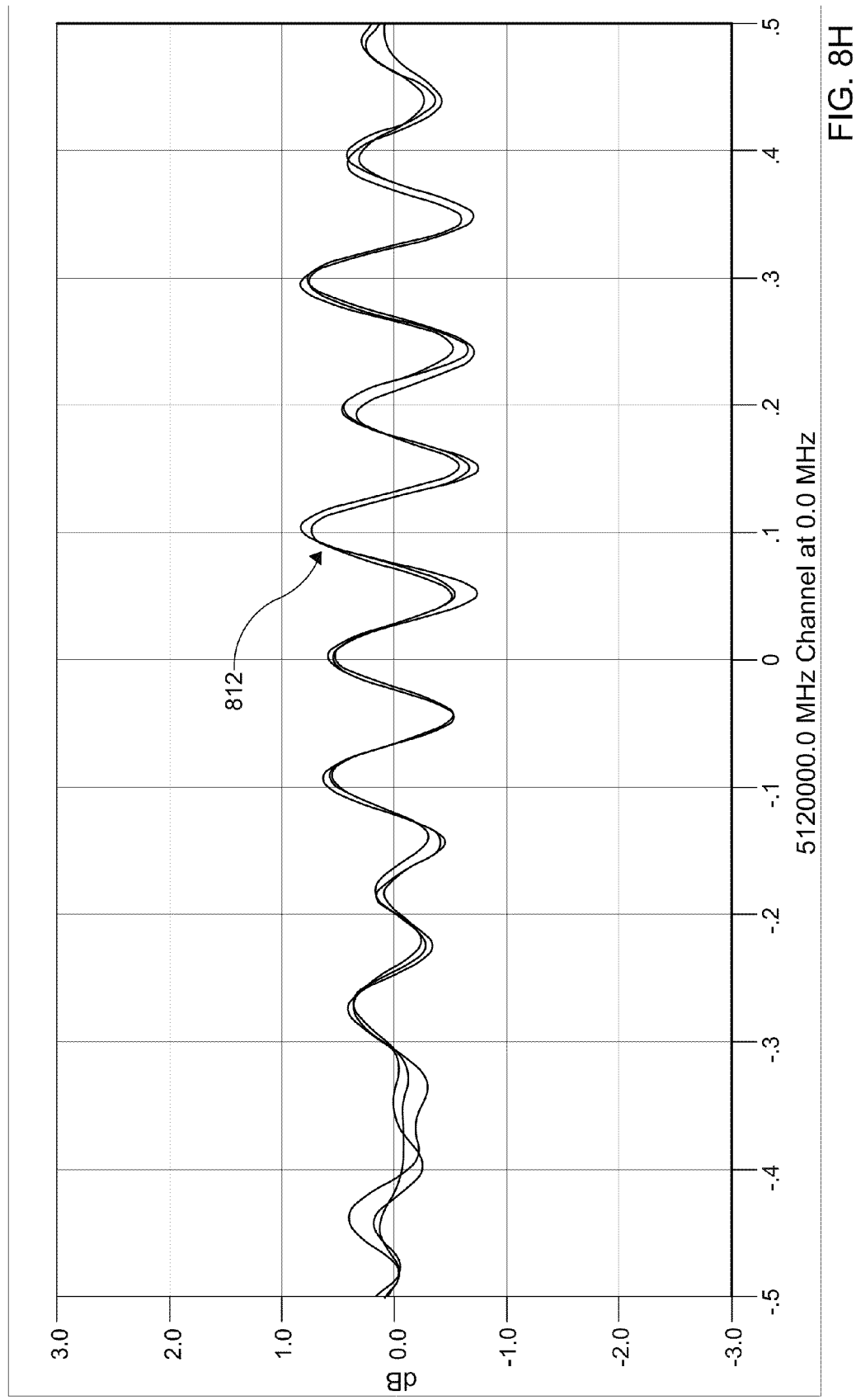
FIG. 8H is a graph of a first grouping of signature waveform.
Figure 8I:
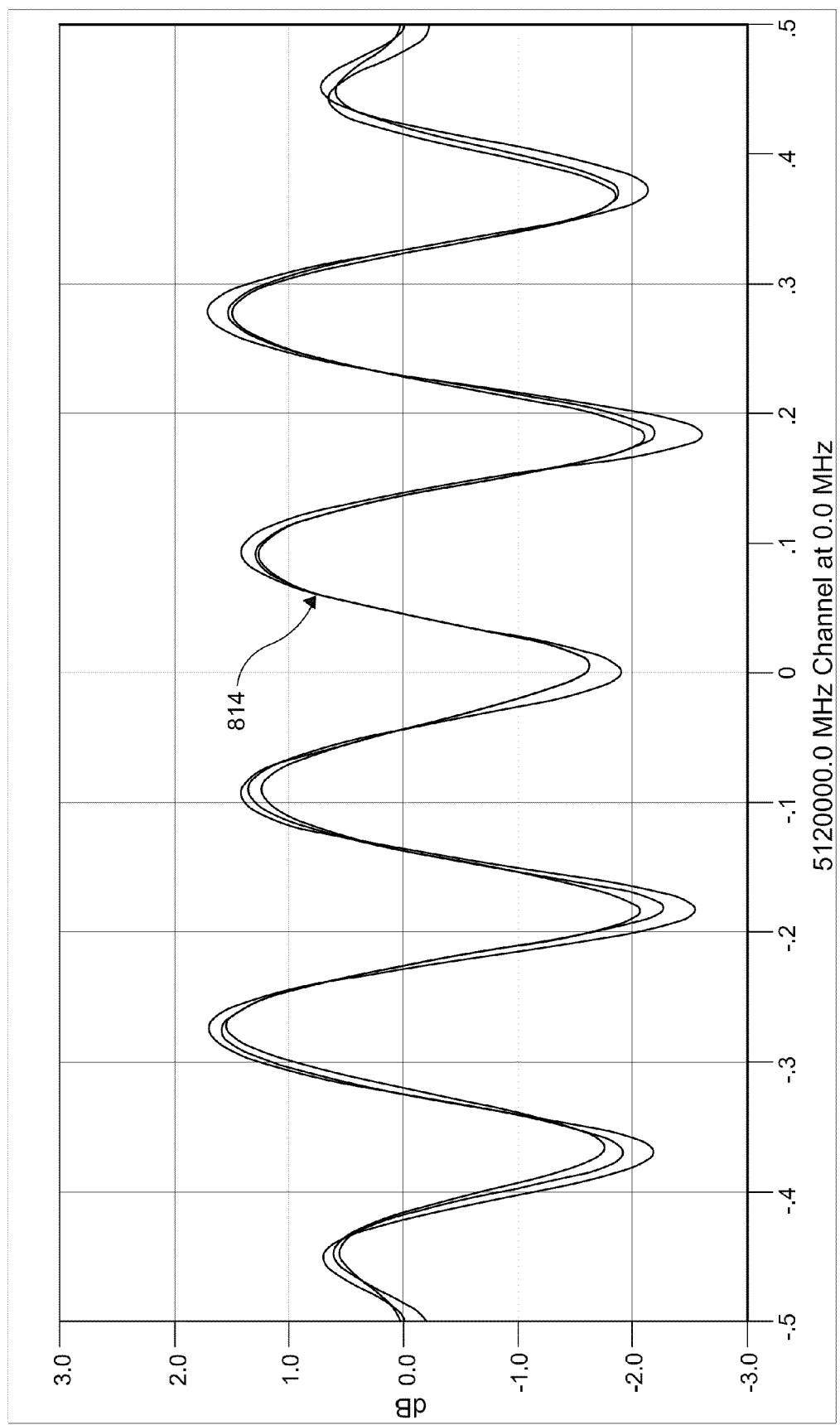
FIG. 8I is a graph of a second grouping of signature waveform.

FIGS. 8G-8I provide an illustrative example of grouped signature waveforms resulting from the method of FIG. 8A. In an aspect, FIG. 8G illustrates a plurality of groups 812, 814 of signature waveforms overlaying each other. FIG. 8H illustrates an example of a first group 812 of signature waveforms. FIG. 8I illustrates an example of a second group 814 of signature waveforms. Accordingly, the members of the resulting groups share common sets of impairments, which are located nearby and/or upstream of the members of the group.

Returning to FIG. 4, in step 414 the impact to service quality due to impairments, network interruption, or other influence on service quality can be assessed. As an example, the impact can be assessed by correlating data from other sources for each DOCSIS device that is a member of the group and computing a set of scores.

Figure 9:
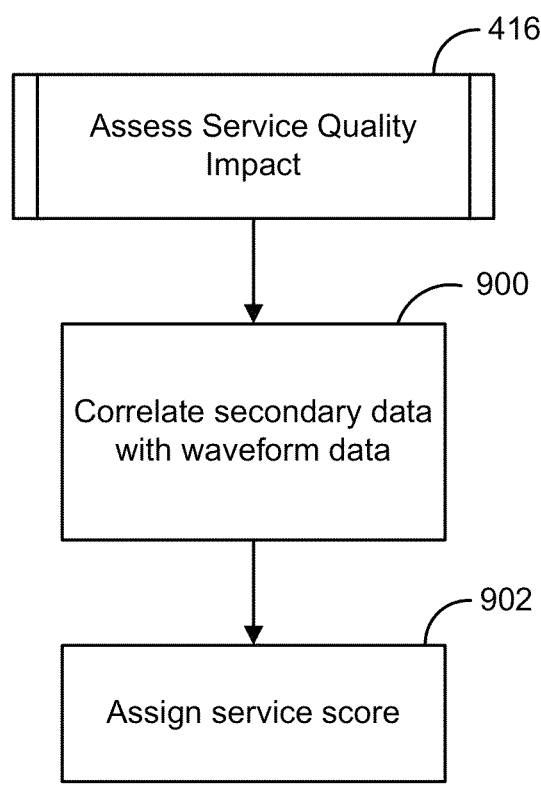
FIG. 9 is a flow chart of an exemplary method.

FIG. 9 illustrates an exemplary method for assessing service quality impact on the network and/or devices (e.g., due to impairments or service interruption. In step 900, the waveform data (e.g., signature waveforms) can be correlated with other data sources (e.g., secondary data) to assess service quality and/or an impact level of service quality. As an example, the secondary data sources can comprise one or more of, DOCSIS SNMP (Simple Network Management Protocol) data, user data from CRM (Customer Relationship Management), GIS (Geographic Information System), climate database(s) for localized weather conditions, and/or billing systems. In step 902, a score can be assigned to each data point (e.g., determined energy level, tap magnitudes), tap, and/or device. As an example, an overall weighted average can be computed based upon one or more scores. In an aspect, a higher weight can be assigned to higher priority customers such as Business Class etc. As a further example, scores (e.g., any metric for ranking and/or classifying network impairments or network users/devices) for one or more devices and/or groups can be stored in a relational data store and can be ranked by various criteria such as the number of impacted customers and/or devices, aggregated values from the secondary data sources, or by ad-hoc queries.

The systems and methods of the present disclosure enhance proactive network maintenance capabilities, specifically the ability to locate and resolve problems before they impact a user experience, and to accurately locate network impairments in an automated fashion, reducing labor costs associated with traditional troubleshooting methods. Assessing the impact to service quality of the physical impairments allows allocation of resources in a manner with the greatest positive impact to the user experience.

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. A method comprising:
   determining a parameter for each of a plurality of network devices;
   determining a plurality of energy levels, each energy level of the plurality of energy levels being associated with a corresponding said determined parameter;
   removing one or more energy levels of the plurality of energy levels from further analysis based on the one or more energy levels being associated with at least one of near-echo locations and far-echo locations;
   generating, for each of at least a portion of the plurality of network devices, a signature based on one or more of remaining energy levels not removed from the plurality of energy levels;
   complex dividing one of the signatures into another of the signatures;
   comparing a result of the complex dividing to a threshold;
   recursively grouping at least the portion of the plurality of network devices based upon iterations of the complex dividing and comparing of respective signatures of the plurality of network devices until no device of the plurality of network devices is a member of more than one group; and
   determining a unique priority score for each group.

2. The method of claim 1, wherein the parameter is derived from equalization coefficient data.

3. The method of claim 1, wherein the parameter comprises an equalizer tap magnitude.

4. The method of claim 1, further comprising normalizing the parameter for one or more of the plurality of network devices.

5. The method of claim 1, wherein the signature comprises a waveform in the frequency domain.

6. The method of claim 1, wherein the complex dividing one of the signatures into another of the signatures comprises generating a ratio value, wherein the ratio value indicates whether the network devices associated with the complex divided signatures should be grouped together.

7. A method comprising:
   determining a parameter for each of a plurality of network devices;
   determining a plurality of energy levels, each energy level of the plurality of energy levels being associated with a corresponding said determined parameter;
   removing one or more energy levels of the plurality of energy levels from further analysis;
   generating, for each of at least a portion of the plurality of network devices, a signature based on one or more of remaining energy levels not removed from the plurality of energy levels;
   identifying each of the plurality of network devices belonging to a first group, wherein the signature of each of the plurality of network devices in the first group is within a pre-defined first threshold;
   identifying each of the plurality of network devices belonging to a second group, wherein the signature of each of the plurality of network devices in the second group is within a pre-defined second threshold;
   recursively grouping one or more network devices belonging to the first group and one or more network devices belonging to the second group, until no network device of the plurality of network devices is a member of more than one group, based on a ratio value of the signatures of one or more network devices belonging to the first group the signatures of one or more network devices belonging to the second group exceeding a pre-defined third threshold; and
   determining a unique priority score for each of the first group and the second group.

8. The method of claim 7, wherein the parameter is a signature waveform in the frequency domain.

9. The method of claim 8, wherein the signature is determined by processing equalization coefficient data of one or more of the plurality of network devices.

10. The method of claim 7, further comprising determining a second parameter for each of the plurality of network devices grouped in the first group and defining the priority score for the first group based upon an analysis of the second parameters of the network devices in the first group.

11. The method of claim 7, further comprising determining a second parameter for each of the plurality of network devices grouped in the first group, wherein the second parameter is based upon one or more of simple network protocol (SNMP) data, billing data, geographic information system (GIS) data, or user information associated with one or more of the plurality of devices grouped in the first group.

12. A system comprising:
   a measurement device in signal communication with a plurality of network devices adapted to measure a characteristic comprising an equalization coefficient for each of the network devices; and
   a processor in communication with the measurement device, the processor configured to:
      determine the characteristic for each of the plurality of network devices,
      determine a plurality of energy levels, each energy level of the plurality of energy levels being associated with a corresponding said determined characteristic;
      remove one or more energy levels of the plurality of energy levels from further analysis based on the one or more energy levels being associated with at least one of near-echo locations and far-echo locations,
      generate, for each of at least a portion of the plurality of network devices, a signature based on one or more of remaining energy levels not removed from plurality of energy levels,
      classify at least the portion of the plurality of the network devices based upon a comparison of a result of complex division of one of the signatures of the plurality of network devices by another of the signatures of the plurality of network devices to a comparator element,
      recursively group at least the portion of the plurality of network devices based upon the classification until no network device of the plurality of network devices is a member of more than one group, and
      determine a unique priority score for each group.

13. The system of claim 12, wherein the characteristic comprises an equalizer tap magnitude.

14. The system of claim 12, wherein the signature comprises a waveform in the frequency domain.

15. The method of claim 1, wherein the recursively grouping comprises recursively grouping the signatures of two or more of the plurality of network devices based on a best fit of the results of the complex dividing.

16. The method of claim 1, wherein the recursively grouping comprises grouping two of the plurality of network devices in a first group if a result of performing the complex dividing between signatures of the two network devices is within a threshold.

17. The method of claim 7, wherein the unique priority score for the first group is a weighted average of a plurality of scores assigned to corresponding devices of the first group.

18. The method of claim 17, wherein the plurality of scores are assigned based on a user priority class, weather information, an impact level of service quality, a number of impacted customers, or a combination thereof.

* * * * *